(12) United States Patent
Brunker et al.

(10) Patent No.: US 7,157,987 B2
(45) Date of Patent: Jan. 2, 2007

(54) TRANSMISSION LINE HAVING A TRANSFORMING IMPEDANCE

(75) Inventors: David L. Brunker, Naperville, IL (US); Victor Zaderej, St. Charles, IL (US)

(73) Assignee: Molex Incorporated, Lisle, IL (US)

( * ) Notice: Subject to any disclaimer, the term of this patent is extended or adjusted under 35 U.S.C. 154(b) by 85 days.

(21) Appl. No.: 11/023,884

(22) Filed: Dec. 23, 2004

(65) Prior Publication Data

US 2005/0174191 A1   Aug. 11, 2005

Related U.S. Application Data

(60) Provisional application No. 60/532,716, filed on Dec. 24, 2003.

(51) Int. Cl.
*H03H 7/38* (2006.01)

(52) U.S. Cl. .............................. 333/34; 333/33; 333/1

(58) Field of Classification Search .................. 333/33, 333/34, 35, 1
See application file for complete search history.

(56) References Cited

U.S. PATENT DOCUMENTS

| | | | |
|---|---|---|---|
| 2002/0033744 A1 | 3/2002 | Sengupta et al. | |
| 2003/0179050 A1* | 9/2003 | Brunker et al. | ................. 333/4 |
| 2003/0181104 A1 | 9/2003 | Brunker et al. | |
| 2005/0151597 A1 | 7/2005 | Brunker et al. | |
| 2005/0151604 A1 | 7/2005 | Brunker et al. | |
| 2005/0156690 A1 | 7/2005 | Brunker et al. | |
| 2005/0168303 A1 | 8/2005 | Brunker et al. | |
| 2005/0201065 A1 | 9/2005 | Regnier et al. | |
| 2005/0202722 A1 | 9/2005 | Regnier et al. | |
| 2006/0139117 A1 | 6/2006 | Brunker et al. | |

FOREIGN PATENT DOCUMENTS

| | | |
|---|---|---|
| EP | 0 343 771 | 11/1998 |
| JP | 3-76301 | 4/1991 |

OTHER PUBLICATIONS

International Search Report For International Patent Application No. PCT/US2004/043881, May 27, 2005.

\* cited by examiner

*Primary Examiner*—Stephen E. Jones
(74) *Attorney, Agent, or Firm*—Thomas D. Paulius

(57) ABSTRACT

A transmission line for high-frequency differential signals and having a transforming impedance is formed into a substrate. The transmission line is comprised of a first slot, the opposing surfaces of which carry a conductive surface capable of carrying electrical signals. By virtue of their dimensions, spacing and dielectric filler, the conductive surfaces constitute a transmission line. A second slot, also with opposing surfaces, each of which also carry a conductive surface but which are spaced differently than the opposing surfaces of the first slot, provide a second transmission line but with a different impedance. The impedances between the two transmission lines are transformed by an impedance transition section of transmission line that is slot section the dimensions of which are tapered to meet the different slot dimensions of the two different transmission line segments.

20 Claims, 16 Drawing Sheets

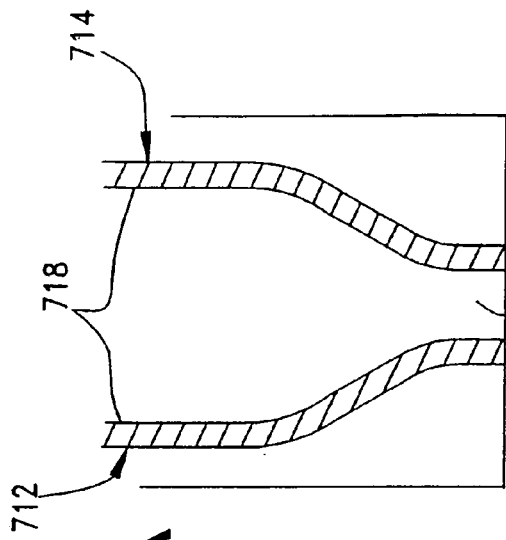
FIG.31A
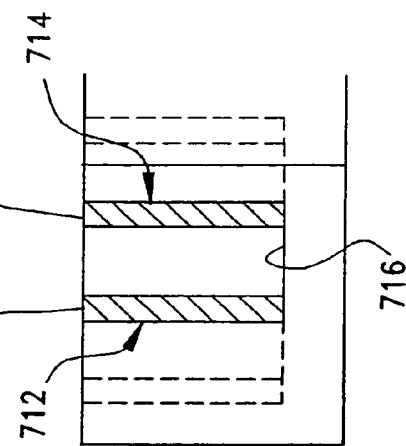
FIG.31B
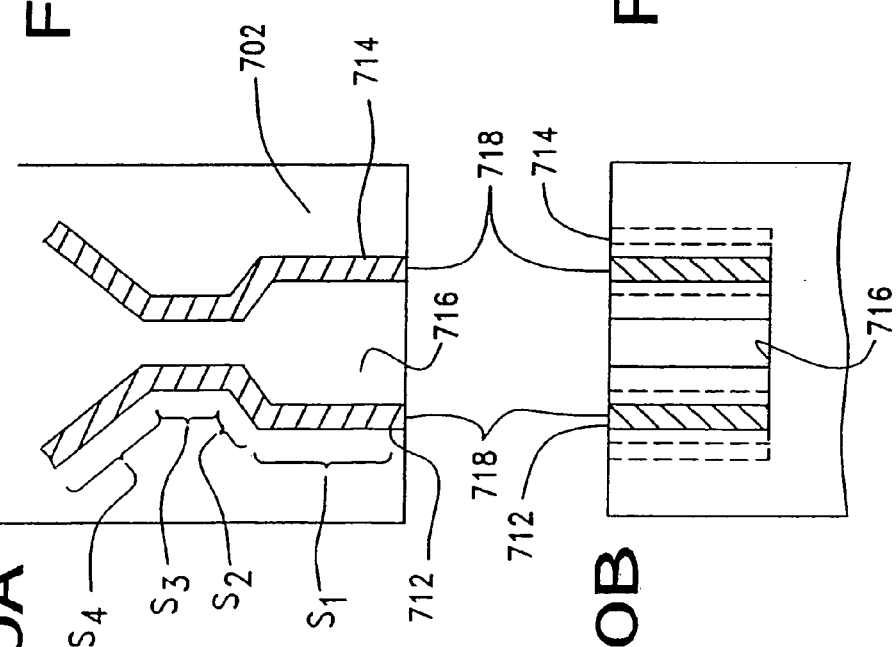
FIG.30A
FIG.30B

TRANSMISSION LINE HAVING A TRANSFORMING IMPEDANCE

REFERENCE TO RELATED APPLICATIONS

This application claims priority from prior U.S. patent application No. 60/532,716, filed Dec. 24, 2003.

BACKGROUND OF THE INVENTION

The present invention pertains to multi-circuit electronic communication systems, and more particularly, to a dedicated transmission channel structure that may be utilized in all parts of transmission systems, chip packaging, printed circuit board construction, interconnect devices and launches from any of the aforementioned components.

Various means of electronic transmission are known in the art. Most, if not all of these transmission means, suffer from inherent speed limitations such as both the upper frequency limit and the actual time a signal requires to move from one point to another within the system, which is commonly referred to as propagation delay. They simply are limited in their electronic performance primarily by their structure, and secondarily by their material composition. One traditional approach utilizes conductive pins, such as those found in an edge card connector as is illustrated in FIG. 1. In this type of structure a plurality of conductive pins, or terminals 20, are arranged within a plastic housing 21 and this arrangement provides operational speeds of about 800 to 900 MHz. An improvement upon this standard structure is represented by edge card connectors that may be known in the art as "Hi-Spec" and which are illustrated in FIG. 2, in which the system includes large ground contacts 25 and small signal contacts 26 disposed within an insulative connector housing 27. The smaller signal contacts 26 couple to the larger ground contacts 25. The signal contacts in these structures are not differential signal contacts, but are merely single-ended signal, meaning that every signal contact is flanked by a ground contact. The operational speeds for this type of system are believed to be about 2.3 Ghz.

Yet another improvement in this field is referred to as a "triad" or "triple" connector in which conductive terminals are disposed within a plastic housing 28 in a triangular pattern, and the terminals include a large ground terminal 29, and two smaller differential signal terminals 30, as illustrated in FIG. 3, and, as described in greater detail U.S. Pat. No. 6,280,209. This triad/triple structure has an apparent upper limit speed of about 4 Ghz. All three of these approaches utilize, in the simplest sense, conductive pins in a plastic housing in order to provide a transmission line for electronic signals.

In each of these type constructions, it is desired to maintain a functional transmission line through the entire delivery path of the system, including through the circuit board(s), the mating interface and the source and load of the system. It is difficult to achieve the desired uniformity within the system when the transmission system is constructed from individual pins. Discrete point-to-point connections are used in these connectors for signal, ground and power. Each of these conductors was designed as either a conductor or a means of providing electrical continuity and usually did not take into account transmission line effects. Most of the conductors were designed as a standard pinfield so that all the pins, or terminals, were identical, regardless of their designated electrical function and the pins were further arranged at a standard pitch, material type and length. Although satisfactory in performance at low operating speeds, at high operational speeds, these systems would consider the conductors as discontinuities in the system that affect the operation and speed thereof Many signal terminals or pins in these systems were connected to the same ground return conductor, and thus created a high signal to ground ratio, which did not lend themselves to high-speed signal transmission because large current loops are forced between the signals and the ground, which current loops reduce the bandwidth and increase the cross talk of the system, thereby possibly degrading the system performance.

Bandwidth ("BW") is proportional to $1/\sqrt{LC}$ where L is the inductance of the system components, C is the capacitance of the system components and BW is the bandwidth. The inductive and capacitive components of the signal delivery system work to reduce the bandwidth of the system, even in totally homogeneous systems without discontinuities. These inductive and capacitive components can be minimized by reducing the overall path length through the system, primarily through limiting the area of the current path through the system and reducing the total plate area of the system elements. However, as the transmission frequency increases, the reduction in size creates its own problem in that the effective physical length is reduced to rather small sizes. High frequencies in the 10 Ghz range and above render most of the calculated system path lengths unacceptable.

In addition to aggregate inductance and capacitance across the system being limiting performance factors, any non-homogeneous geometrical and/or material transitions create discontinuities. Using about 3.5 Ghz as a minimum cutoff frequency in a low voltage differential signal system operating at around 12.5 Gigabits per second (Gbps), the use of a dielectric with a dielectric constant of about 3.8 will yield a critical path length of about 0.25 inches, over which length discontinuities may be tolerated. This dimension renders impracticable the ability of one to construct a system that includes a source, transmission load and load within the given quarter-inch. It can thus be seen that the evolution of electronic transmission structures have progressed from uniform-structured pin arrangements to functionally dedicated pins arrangements to attempted unitary structured interfaces, yet the path length and other factors still limit these structures. With the aforementioned prior art structures, it was not feasible to carry high frequency signals due to the physical restraints of these systems and the short critical path lengths needed for such transmission.

In order to obtain an effective transmission system, one must maintain a constant and dedicated transmission line over the entire delivery path: from the source, through the interface and to the load. This would include the matable interconnects and printed circuit boards and the interconnect signal launch into and out from the printed circuit board or other transmission media such as cables and even semiconductor chip packaging. This is very difficult to achieve when the delivery system is constructed from individual, conductive pins designed to interconnect with other individual conductive pins because of potential required changes in the size, shape and position of the pins/terminals with respect to each other. For example, in a right angle connector, the relationship between the rows of pins/terminals change in both the length and the electrical coupling. High speed interconnect design principles that include all areas between the source and load of the system including printed circuit boards, board connectors and cable assemblies are being used in transmission systems with sources of up to 2.5 Gbps. One such principle is the principle of ground by design which provides added performance over a standard pin field in that coupling is enhanced between the signal and ground paths and single-ended operation is complimented. Another principle being used in such systems includes impedance tuning to minimize discontinuities. Yet another design principle is pinout optimization where signal and return paths are assigned to specific pins in the pin field to maximize the performance. These type of systems all are limited with respect to attaining the critical path lengths mentioned above.

The present invention is directed to an improved transmission or delivery system that overcomes the aforementioned disadvantages and which operates at higher speeds.

SUMMARY OF THE INVENTION

The present invention is therefore directed to an improved transmission structure that overcomes the aforementioned disadvantages and utilizes grouped electrically conductive elements to form a unitary mechanical structure that provides a complete electronic transmission channel that is similar in one sense to a fiber optic system. The focus of the invention is on providing a complete, copper-based electronic transmission channel rather than utilizing either individual conductive pins or separable interfaces with copper conductors as the transmission channel, the transmission channels of the invention yielding more predictable electrical performance and greater control of operational characteristics. Such improved systems of the present invention are believed to offer operating speeds for digital signal transmission of up to at least 12.5 GHz at extended path lengths that are much greater than 0.25 inch.

Accordingly, it is a general object of the present invention to provide an engineered waveguide which functions as a grouped element channel link, where the link includes an elongated dielectric body portion and at least two conductive elements disposed along the exterior surface thereof.

Another object of the present invention is to provide a high-speed channel link (or transmission line) having an elongated body portion of a given cross-section, the body portion being formed from a dielectric with a selected dielectric constant, and the link having, in its most basic structure, two conductive elements disposed on the exterior surface thereof, the elements being of similar size and shape and oriented thereon, in opposition to each other, so as to steer the electrical energy wave traveling through the link by establishing particular electrical and magnetic fields between the two conductive elements and maintaining these fields throughout the length of the channel link.

A further object of the present invention is to control the impedance of the channel link by selectively sizing the conductive elements and the gaps therebetween on the exterior surface of the elongated body to maintain balanced or unbalanced electrical & magnetic fields.

Yet another object of the present invention is to provide a improved electrical transmission channel that includes a flat substrate, and a plurality of grooves formed in the substrate, the grooves having opposing sidewalls and the grooves being spaced apart by intervening lands of the substrate, the sidewalls of the grooves having a conductive material deposited thereon, such as by plating or deposition, to form electronic transmission channels within the grooves.

A still further object of the present invention is to provide a pre-engineered wave guide in which at least a pair of conductive elements are utilized to provide differential signal transmission, i.e., signal in ("+") and signal out ("−"), the pair of conductive elements being disposed on the exterior of the dielectric body so as to permit the establishment of capacitance per unit length, inductance per unit length, impedance, attenuation and propagation delay per unit length, and establishing these pre-determined performance parameters within the channels formed by the conductive elements.

A yet further object of the present invention is to provide an improved transmission line in the form of a solid link, of preferably uniform, circular cross-section, the link including at least a pair of conductive elements disposed thereon that serve to guide the electrical wave therethrough, the link including at least one thin filament of dielectric material having two conductive surfaces disposed thereon, the conductive surfaces extending lengthwise of the filament and separated by two circumferential arcuate extents, the conductive surfaces further being separated from each other to form a discrete, two-element transmission channel that reduces the current loop and in which the signal conductors are more tightly aligned.

Yet another object of the present invention is to provide a non-circular transmission line for high speed applications, which includes an elongated rectangular or square dielectric member having an exterior surface with at least four distinct sectors disposed thereon, the dielectric member including a pair of conductive elements aligned with each other and disposed on two of the sectors, while separated by an intervening sector.

The present invention accomplishes the above and other objects by virtue of its unique structure. In one principal aspect, the present invention includes a transmission line that is formed from a dielectric with a preselected dielectric constant and a preselected cross-sectional configuration. A pair of conductive surfaces are disposed on the dielectric line, or link, and one is preferably aligned with each other and separated from each other. The conductive surfaces serve as wave guides for guiding electrical waves along the transmission link.

In another principal aspect of the present invention, the conductive elements are grouped together as a pair on a single element, thus defining a unitized wave guide that may be run between and among successive printed circuit boards and connected thereto without difficulty. The conductive surfaces may be formed by selectively depositing conductive material thereon, such as by plating, the exterior surface of the dielectric body, or by molding or otherwise attaching an actual conductor to the body. In this manner, the dielectric may be formed with bends and the conductive surfaces that exist on the surface thereof maintains their spaced apart arrangement of grouped channel conductors along and throughout the bends of the dielectric body.

In yet another principal aspect of the invention, the exterior of the transmission line may be covered by a protective outer jacket, or sleeve. The conductive surfaces may be disposed on the dielectric body in a balanced arrangement with equal widths, or an unbalanced arrangement with one or more pairs of conductive elements, and the conductive elements having different widths. Three conductive elements may be disposed on the dielectric body to support a differential triple on the transmission line utilizing a pair of differential signal conductors and an associated ground conductor. The number of conductive surfaces is limited only by the size of the dielectric body, and four such discrete conductive elements may be used to support two different signal channels or a single differential pair with dual grounds.

In still another principal aspect of the present invention, a unitary transmission line is formed within one cavity, or within a plurality of selectively-sized metallized cavities are formed within a substrate. The substrate is grooved to form the cavities and the sidewalls of the grooves may be plated with a conductive material. The air gap between the sidewalls of the cavities, or grooves, in this instance, serves as the dielectric of the transmission channel. In this structure, the dielectric constant of air is different and less than the dielectric constant of the dielectric body so as to influence electrical affinity, and particularly coupling between the conductive elements in the grooves and not between adjacent signal transmission channels of the transmission line, while increasing transmission speed.

In yet another principal aspect of the present invention, the aforementioned transmission links may be used to carry power. In such circumstances, the underlying transmission line will include a grooved dielectric, with a continuous contact region being formed within the grooves, i.e., covering the sidewalls and bases of the groove. The continuous contact area that is present on these three surfaces for the length of the groove extends the current carrying capability of the structure. A ground plane may be utilized to increase capacitive coupling among the power channels and the ground plane to reduce the source impedance of the overall structure. The transmission line may be formed with projecting ridges, or lands, that serve to define troughs there between. The conductive surfaces are formed in the troughs by way of a continuous process, such as selective plating, so that a continuous plated trough, i.e., two sidewalls and an interconnecting base are formed which extend for the length of the transmission line. This increases the current carrying capability of the transmission line. A high capacitance may then be created across the dielectric between two signal conductors to reduce the source impedance of the system.

The power carrying aspect of the invention may be further supplemented by the forming of high density contact sets within the system. In a grooved transmission line the opposing sidewalls of the grooves may be plated with a conductive material to form continuous contacts that extend the length of the transmission line and opposite polarity signals (i.e., "+" and "−") may be carried along these contacts. A plug assembly may be molded, such as by way of insert molding into the grooves, either individually or as an assembly encompassing two or more such grooves to insulate and isolate the opposed contact pairs, which will result in an increased voltage standoff. A conformal coating may also be used to achieve a similar aim.

The transmission lines of the invention may carry both signals and power and thus may be easily divided into separate signal channels and power channels. The signal channels may be made with conductive strips or paths of a pre-selected width, while the power channels, in order to carry high currents, may include either wider strips or an enlarged, continuous conductor strip. The wider strips are enlarged plate areas as compared to the signal strips and have a high capacitance. The signal and power channels may be separated by a wide, non-conductive area of the transmission structure that serves as an isolation region. Because the isolation region may be formed during the forming of the underlying dielectric base, the isolation region may be readily defined to minimize cross-contamination or electrical interference.

These and other objects, features and advantages of the present invention will be clearly understood through a consideration of the following detailed description.

BRIEF DESCRIPTION OF THE DRAWINGS

In the course of this detailed description, the reference will be frequently made to the attached drawings in which:

FIG. 5 is a schematic end view of the grouped element channel link of FIG. 4 illustrating the arcuate extents of the conductive elements and the spacing there between;

FIG. 30A is a top view of the transmission line shown in FIG. 29;

FIG. 30B is an end view of the transmission line shown in FIG. 30A;

FIG. 31A is a top view of an alternate embodiment of transmission line having transforming impedance but having smooth transitions between segments;

FIG. 31B is an end view of the transmission line shown in FIG. 31A;

DETAILED DESCRIPTION OF THE PREFERRED EMBODIMENTS

Figure 1:
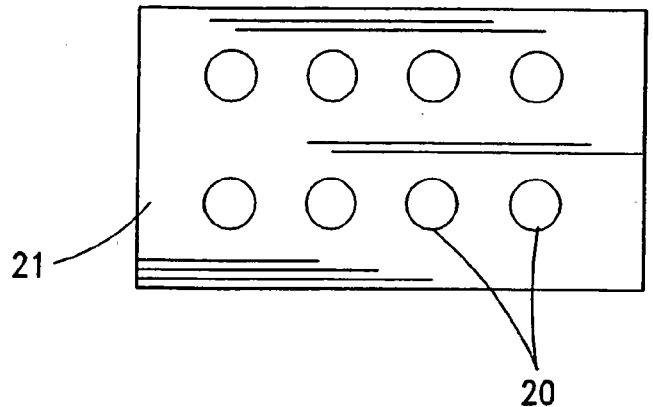
FIG. 1 is a schematic plan view of the terminating face of a conventional connector.
Figure 2:
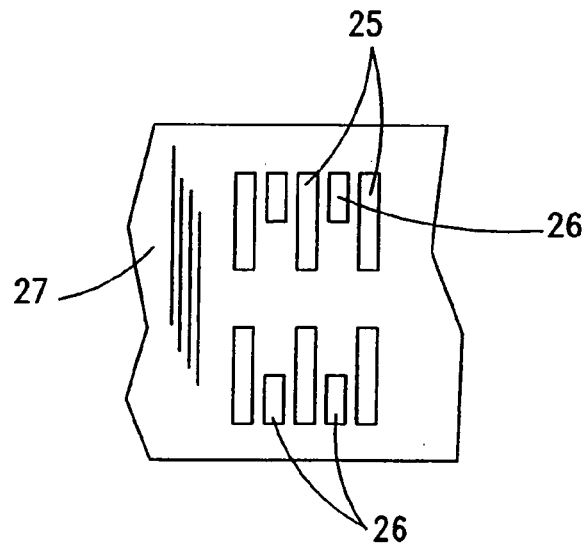
FIG. 2 is a schematic plan view of an edge card used in a high speed connector.
Figure 3:
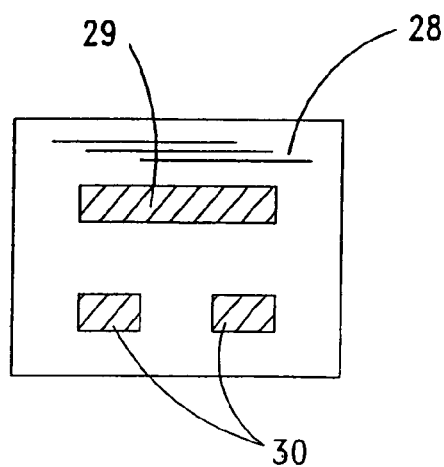
FIG. 3 is a schematic elevational view of a high speed connector utilizing a triad or triple.
Figure 4:
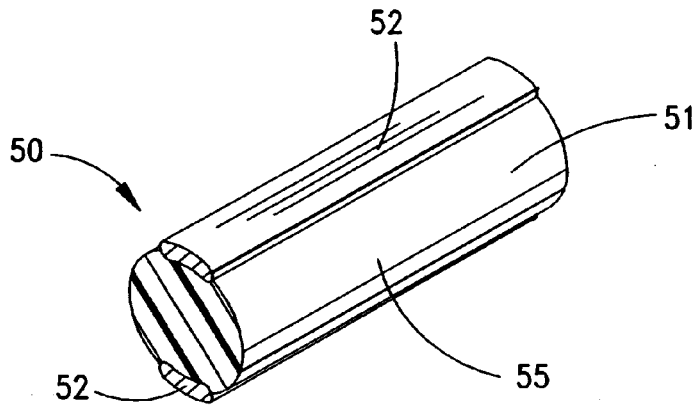
FIG. 4 is a perspective view of a grouped element channel link constructed in accordance with the principles of the present invention.
Figure 5:
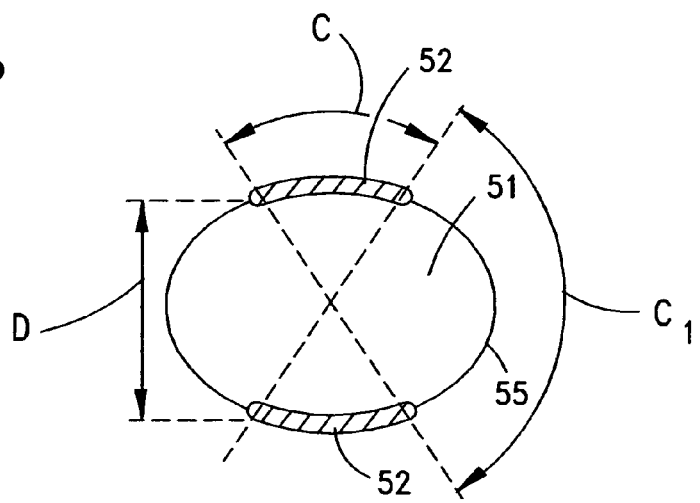

FIG. 4 illustrates a grouped element channel link 50 constructed in accordance with the principles of the present invention. It can be seen that the link 50 includes an elongated, dielectric body 51, preferably a cylindrical filament, that is similar to a length of fiber optic material. It differs therefrom in that the link 50 acts as a pre-engineered wave guide and a dedicated transmission media. In this regard, the body 51 is formed of a dedicated dielectric having a specific dielectric constant and a plurality of conductive elements 52 applied thereto. In FIGS. 4 and 5, the conductive elements 52 are illustrated as elongated extents, traces or strips, 52 of conductive material and, as such, they may be traditional copper or precious metal extents having a definite cross-section that may be molded or otherwise attached, such as by adhesive or other means to the dielectric body of the link 50. They may also be formed on the exterior surface 55 of the body 51 such as by a suitable plating or vacuum deposition process. The conductive traces 52 are disposed on the exterior surface and have a width that extends along the perimeter of the dielectric body.

Figure 29:
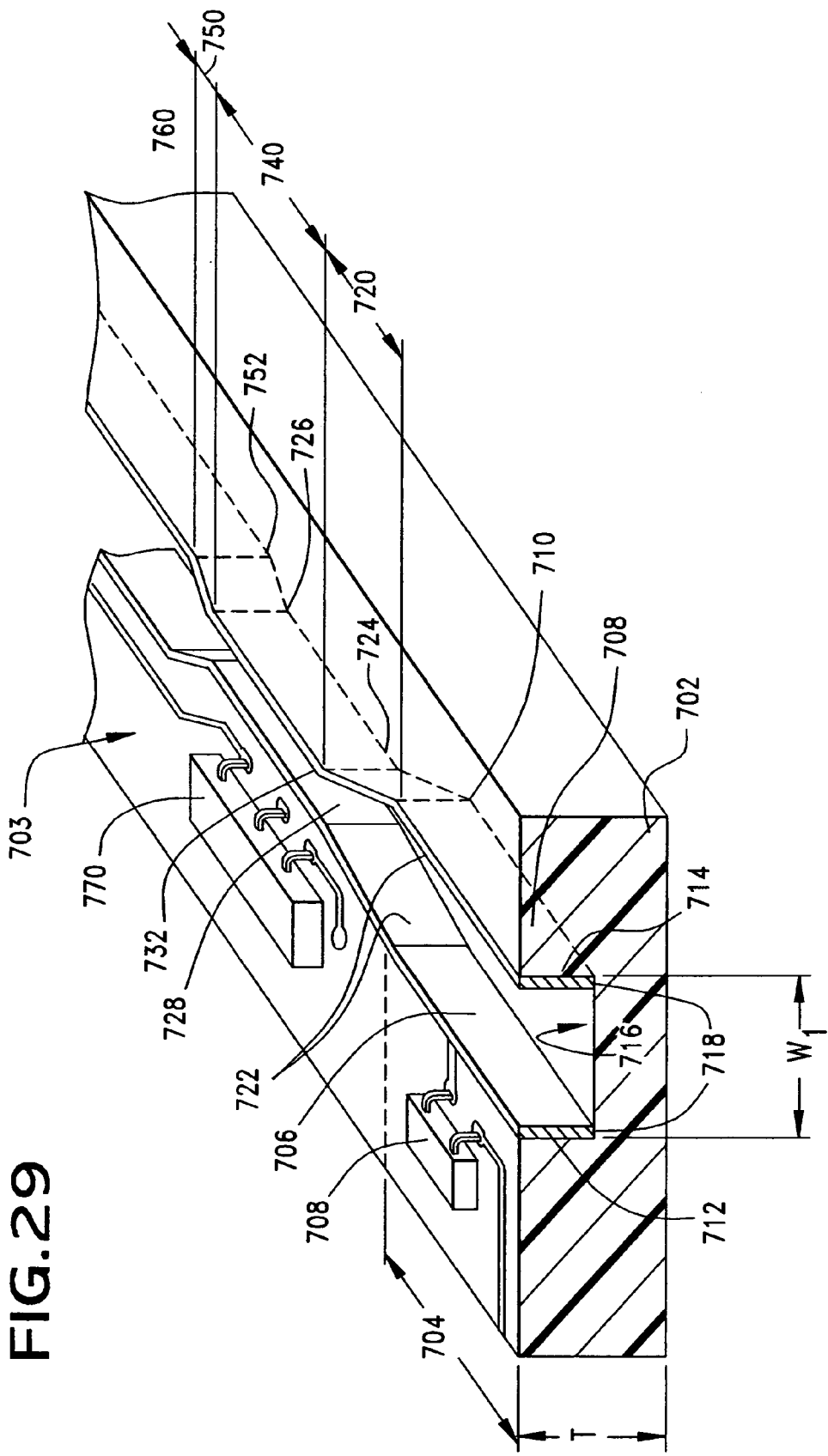
FIG. 29 is a perspective view of a transmission line for high frequency signals and having a transforming impedance.

At least two such conductors are used on each link, typically are used for signal conveyance of differential signals, such as +0.5 volts and −0.5 volts. The use of such a differential signal arrangement permits us to characterize structures of this invention as pre-engineered waveguides that are maintained over substantially the entire length of the signal delivery path. The use of the dielectric body 51 provides for preferred coupling to occur within the link. In the simplest embodiment, as illustrated in FIG. 5, the conductive elements are disposed on two opposing faces, so that the electrical affinity of each of the conductive elements is for each other through the dielectric body upon which they are supported, or in the case of a conductive channel as will be explained in greater detail to follow and as illustrated in FIGS. 29–30, the conductive elements are disposed on two or more interior faces of the cavity/cavities to establish the primary coupling mode across the cavity gap and through an air dielectric. In this manner, the links of the present invention may be considered as the electrical equivalent to a fiber optic channel or extent.

The present invention is directed to electrical waveguides. The waveguides of the present invention are intended to maintain electrical signals at desired levels of electrical affinity at high frequencies from about 1.0 Ghz to at least 12.5 Ghz and preferably higher. Optical waveguides, as described in U.S. Pat. No. 6,377,741, issued Apr. 23, 2002, typically rely upon a single outer coating, or cladding, having mirror-like reflective properties to maintain the light particles moving in a selected direction. Openings in the outer coating/cladding will result in a dispersal of the light traveling through the waveguide, which adversely affects the light beam of the waveguide. Microwave waveguides are used at very high frequencies to direct the energy of the microwave beam, rather than transmit it as exemplified by U.S. Pat. No. 6,114,677, issued Sep. 5, 2002 in which a microwave waveguide is used to direct the microwaves at the center portion of an oven. Such a directional aim is also utilized the microwave antenna art. In each instance, these type of waveguides are used to focus and direct the energy of the light of microwave traveling through them, whereas in the present invention, the entire waveguide structure is engineered to maintain an electrical signal at desired frequency(ies) and impedance, capacitance and inductance.

The effectiveness of the links of the present invention are dependent upon the guiding and maintenance of digital signals through the channel link, by utilizing two or more conductive surfaces of electrical containment. This will include maintaining the integrity of the signal, controlling the emissions and minimizing loss through the link. The channel links of the present invention contain the electromagnetic fields of the signals transmitted therethrough by controlling the material of the channel link and the geometries of the system components so that preferred field coupling will be provided. Simply stated, the present invention creates an engineered transmission line by defining a region of electrical affinity, i.e., the dielectric body 51, that is bounded by conductors, i.e., conductive surfaces 52, of opposing charge, i.e., negative and positive differential signals.

As illustrated better in FIG. 5, the two conductive surfaces 52 are arranged on the dielectric body 51 in opposition to each other. The dielectric body 51 shown in FIG. 4 takes the form of a cylindrical rod, while the dielectric body shown in FIG. 5 has an oval-like configuration. In each such instance, the conductive surfaces or traces 52, extend for distinct arc lengths. Both FIGS. 4 and 5 are representative of a "balanced" link of the invention where the circumferential extent, or arc length C of the two conductive surfaces 52 is the same, and the circumferential extents or arc lengths C1 of the non-conductive exterior surfaces 55 of the dielectric body 51 are also the same. This length may be considered to define a gross separation D between the conductive surfaces. As will be explained below, the link may be "unbalanced" with one of the conductive surfaces having an arc length that is greater than the other, and in such an instance, the transmission line is best suited for single-ended, or non-differential signal applications. In instances where the dielectric body and link are circular, the link may serve as a contact pin and so be utilized in connector applications. This circular cross-section demonstrates the same type of construction as a conventional round contact pin.

Figure 6:
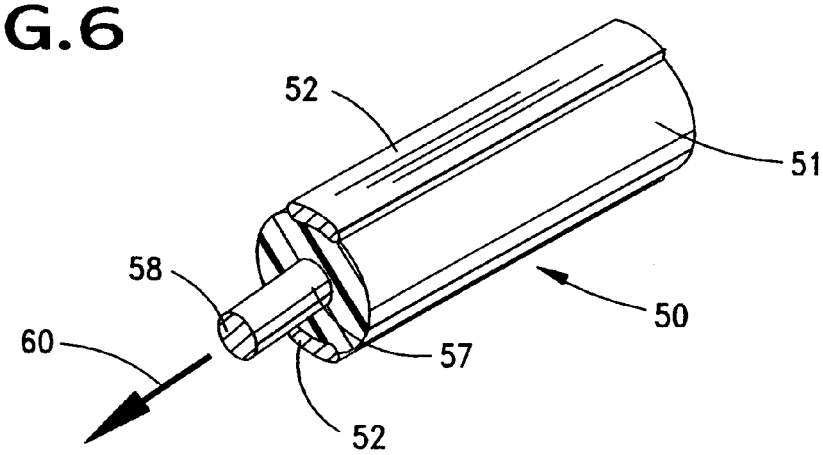
FIG. 6 is a perspective view of an alternate embodiment of a grouped element channel link constructed in accordance with the principles of the present invention.

As illustrated in FIG. 6, the links of the present invention may be modified to provide not only multiple conductive elements as part of the overall system transmission media, but may also incorporate a coincident and coaxial fiber optic wave guide therewithin for the transmission of light and optical signals. In this regard, the dielectric body 51 is cored to create a central opening 57 through which an optical fiber 58 extends. Electrical signals may be transmitted through this link as well as light signals 60.

Figure 7:
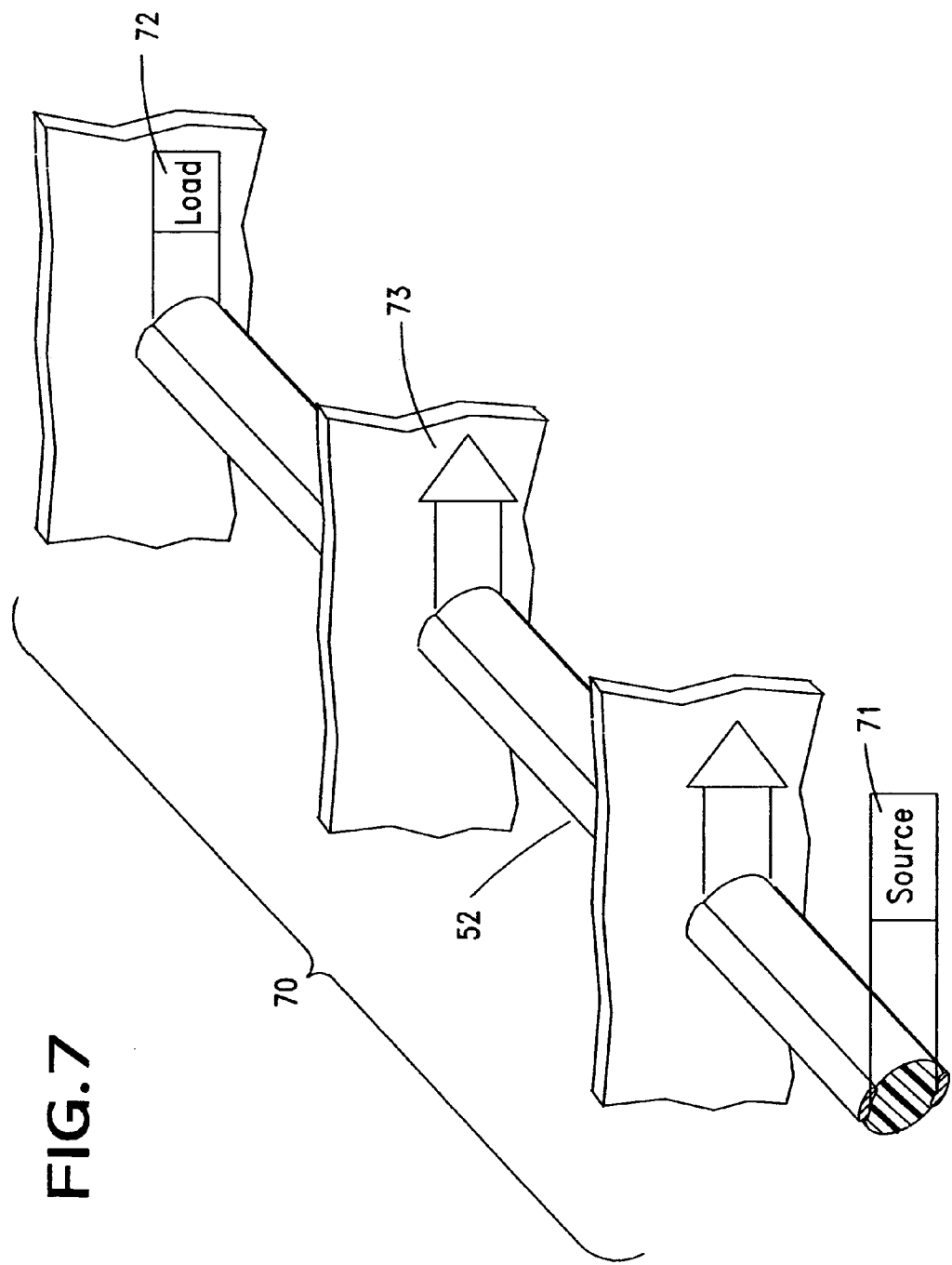
FIG. 7 is a schematic view of a transmission link of the present invention used to connect a source with a load having intermediate loads on the transmission link.

FIG. 7 schematically illustrates a transmission line 70 incorporating a link 50 of the present invention that extends between a source 71 and a load 72. The conductive surfaces 52 of the link serve to interconnect the source and load together, as well as other secondary loads 73 intermediate the source and the load. Such secondary loads may be added to the system to control the impedance through the system. A line impedance is established at the source and may be modified by adding secondary loads to the transmission line.

Figure 8:
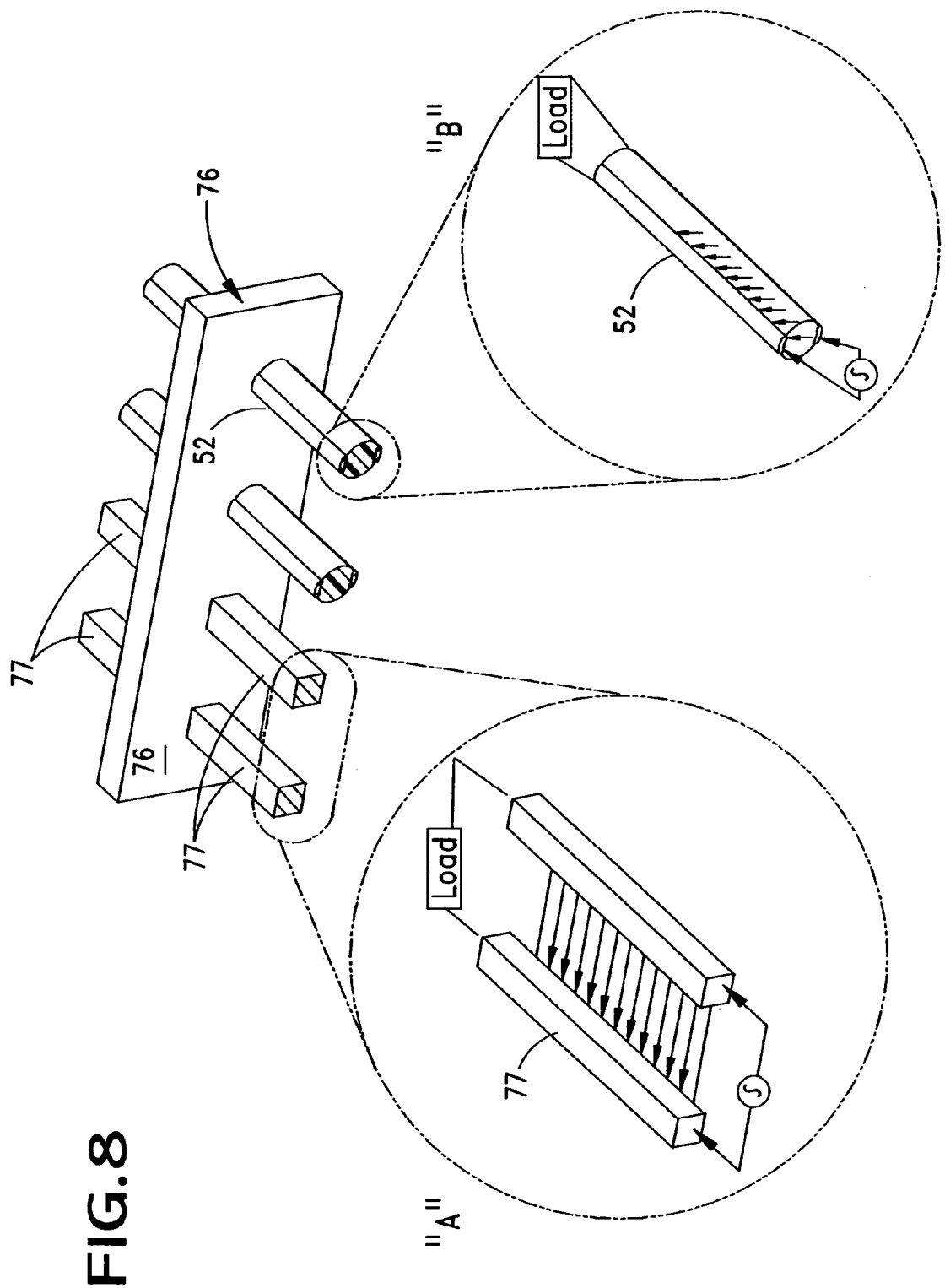
FIG. 8 is a schematic view of a connector element utilizing both conventional contacts "A" and the transmission links "B" of the invention, with enlarged detail portions at "A" and "B" thereof, illustrating the occurrence of inductance in the respective systems.
Figure 9:
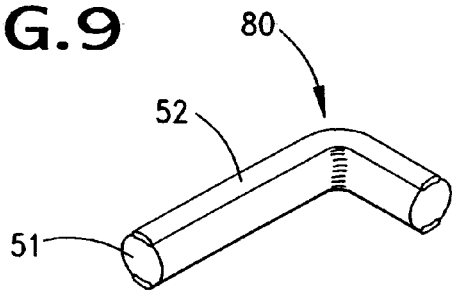
FIG. 9 is a perspective view of an alternate construction of a link of the invention with a right angle bend formed therein.
Figure 10:
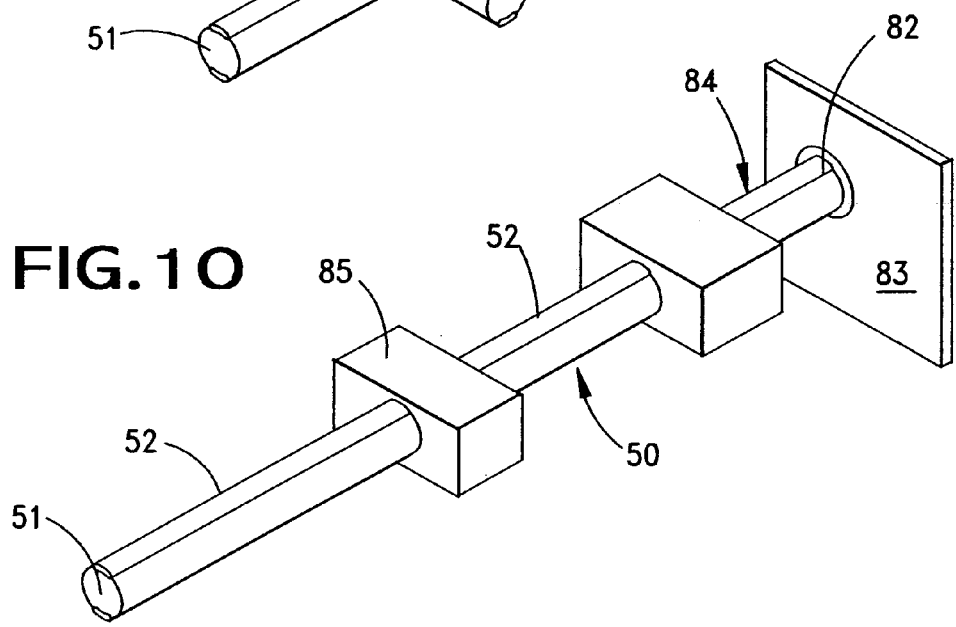
FIG. 10 is a schematic view of a transmission line utilizing the links of the present invention.

FIG. 8 illustrates, schematically, the difference between the links of the present invention and conventional conductors, which are both illustrated as supported by a dielectric block 76. Two discrete, conventional conductors 77 are formed from copper or another conductive material and extend through the block 76, in the manner of pins. As shown in enlargement "A", the two discrete conductor presents an open cell structure with a large inductance (L) because of the enlarged current loop. Quite differently, the links of the present invention have a smaller inductance (L) at a constant impedance due to the proximity of the conductive surfaces to each other as positioned as the dielectric body 51. The dimensions of these links 50 can be controlled in the manufacturing process and extrusion will be the preferred process of manufacturing with the conductive surfaces being extended with the dielectric body or separately applied of the extrusion, such as by a selective plating process so that the resulting construction is of the plated plastic variety. The volume of the dielectric body 51 and the spacing between conductive elements disposed thereon may be easily controlled such an extrusion process. The conductive surfaces preferably extend for the length of the dielectric body and may end slightly before the ends thereof at a location where it is desired to terminate the transmission line to a connector, circuit board or similar component, As FIG. 9 illustrates, the dielectric body may have a bend 80 forward therewith in the form of the 90.degree. right-angle bend illustrated or in any other angular orientation. As shown, the conductive surfaces 52 extend through the bend 80 with the same separation spacing between them and the same width with which the conductive surfaces start and end. The dielectric body 51 and the conductive surfaces 52 are easily maintained in their spacing and separation through the bend to eliminate any potential losses FIG. 10 illustrates a transmission line using the links of the invention. The link 50 is considered as a transmission cable formed from one or more single dielectric bodies 51, and one end 82 of it is terminated to a printed circuit board 83. This termination may be direct in order to minimize any discontinuity at the circuit board. A short transfer link 84 that maintains any discontinuities at a minimum is also provided. These links 84 maintain the grouped aspect of the transmission link. Termination interfaces 85 may be provided where the link is terminated to the connector with minimum geometry discontinuity or impedance discontinuity. In this manner, the grouping of the conductive surfaces is maintained over the length of the transmission line resulting in both geometric and electrical uniformity.

Figure 11:
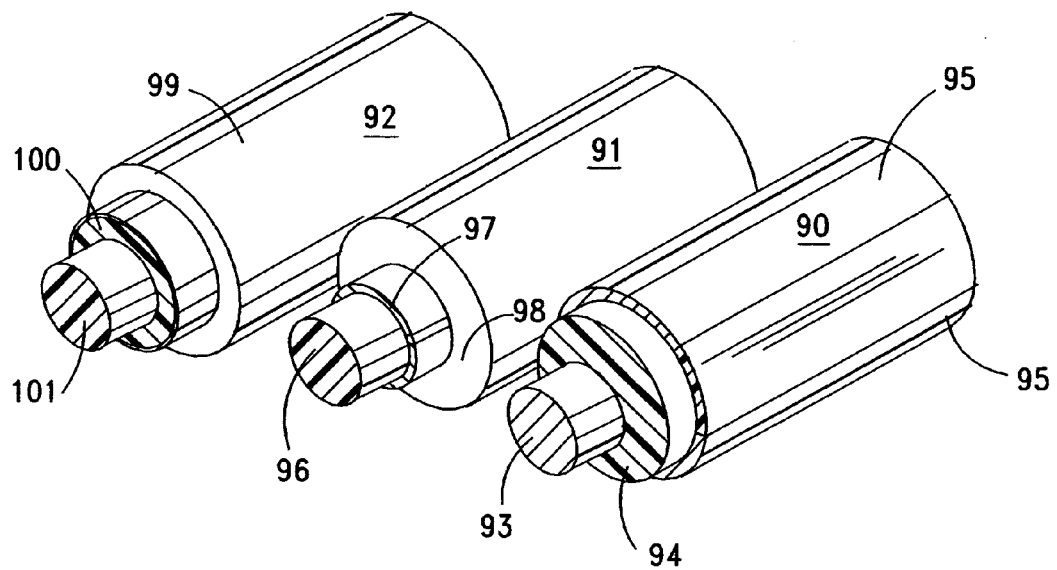
FIG. 11 is a perspective view illustrating alternate media compositions of the links of the invention.

FIG. 11 illustrates a variety of different cross-sections of the transmission links 50 of the invention. In the rightmost link 90, a central conductor 93 is encircled by a hollow dielectric body 94 which in turn, supports multiple conductive surfaces 95 that are separated by an intervening space, preferably filled with portions of the dielectric body 94. This construction is suitable for use in power applications where power is carried by the central conductor 93. In the middle link 91 of FIG. 11, the central cover 96 is preferably made of a selected dielectric and has conductive surfaces 97 supported on it. A protective outer insulative jacket 98 is preferably provided to protect and or insulate the inner link. The leftmost link 92 of FIG. 11 has a protective outer jacket 99 that encloses a plateable polymeric ring 100 that encircles either a conductive or insulative core 101. Portions 101 of the ring 100 are plated with a conductive material and are separated by unplated portions to define the two or more conductive surfaces desired on the body of the ring. Alternatively, one or the elements surrounding the core or of the link 92 may be filled with air and may be spaced away from an inner member by way of suitable standoffs or the like.

Figure 12:
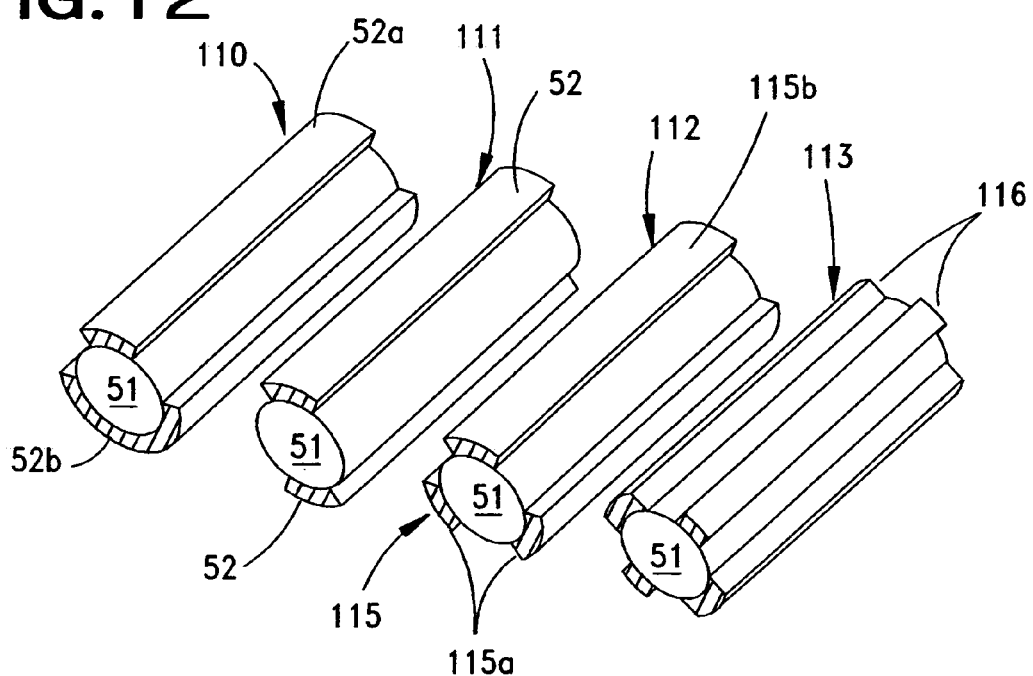
FIG. 12 is a perspective view of an array of different shapes of dielectric bodies illustrating alternate conductive surface arrangements.

FIG. 12 illustrates an array of links 110–113 that have their outer regions combined with the dielectric body 51 to form different types of transmission links. Link 110 has two conductive surfaces 52a, 52b of different arc lengths (i.e., unbalanced) disposed on the outer surface of the dielectric body 51 so that the link 110 may provide single-ended signal operation. Link 111 has two equal-spaced and sized (or "balanced") conductive elements 52 to provide an effective differential signal operation.

Link 112 has three conductive surfaces 115 to support two differential signal conductors 115a and an assorted ground conductor 115b. Link 113 has four conductive surfaces 116 disposed on its dielectric body 51 in which the conductive surfaces 116 may either include two differential signal channels (or pairs) or a single differential pair with a pair of associated grounds.

Figure 13:
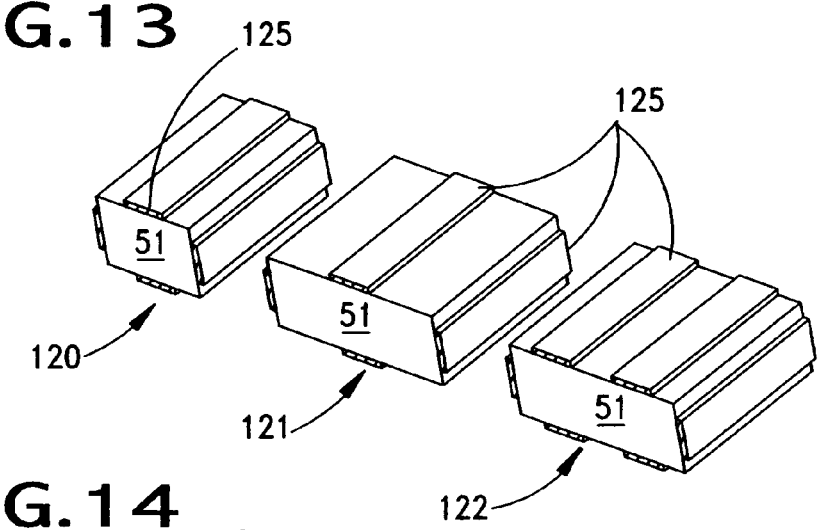
FIG. 13 is a perspective view of an array of non-circular cross-section dielectric bodies that may be used to form links of the invention.

FIG. 13 illustrates an array of one-type of non-circular links 120–122 that polygonal configurations, such as square configurations, as with link 120 or rectangular configurations as with links 121–122. The dielectric bodies 51 may be extruded with projecting land portions 125 that are plated or otherwise covered with conductive material. Individual conductive surfaces are disposed on individual sides of the dielectric body and preferably differential signal pairs of the conductive surfaces are arranged on opposing sides of the body. These land portions 125 may be used to "key" into connector slots of terminating connectors in a manner so that contact between the connector terminals (not shown) and the conductive faces 125 is easily effected.

Figure 14:
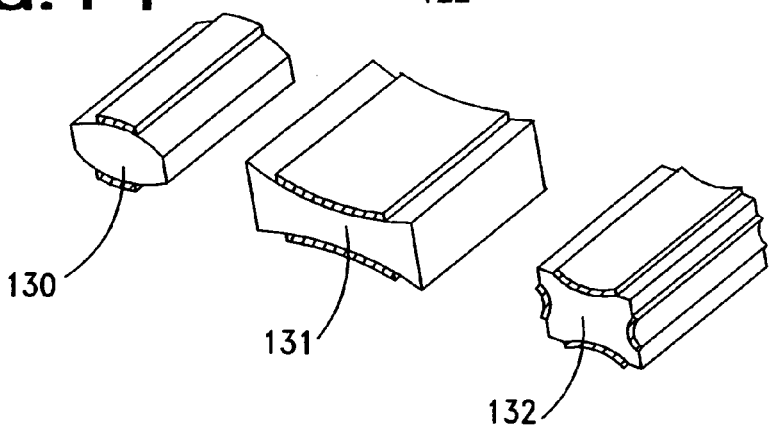
FIG. 14 is a perspective view of another array of non-circular cross-section dielectric bodies suitable for use as links of the invention.

FIG. 14 illustrates some additional dielectric bodies that may be utilized with the present invention. One body 130 is shown as convex, while the other two bodies 131, 132 are shown as being generally concave in configuration. A circular cross-section of the dielectric bodies has a tendency to concentrate the electrical field strength at the corners of the conductive surfaces, while a slightly convex form as shown in body 130, has a tendency to concentrate the field strength evenly, resulting in lower attenuation. The concave bodies, as illustrated by dielectric bodies 131, 132 may have beneficial crosstalk reduction aspects because it focuses the electrical field inwardly. The width or arc lengths of these conductive surfaces, as shown in FIG. 14 are less that the width or arc lengths of the respective body sides supporting them.

Figure 16:
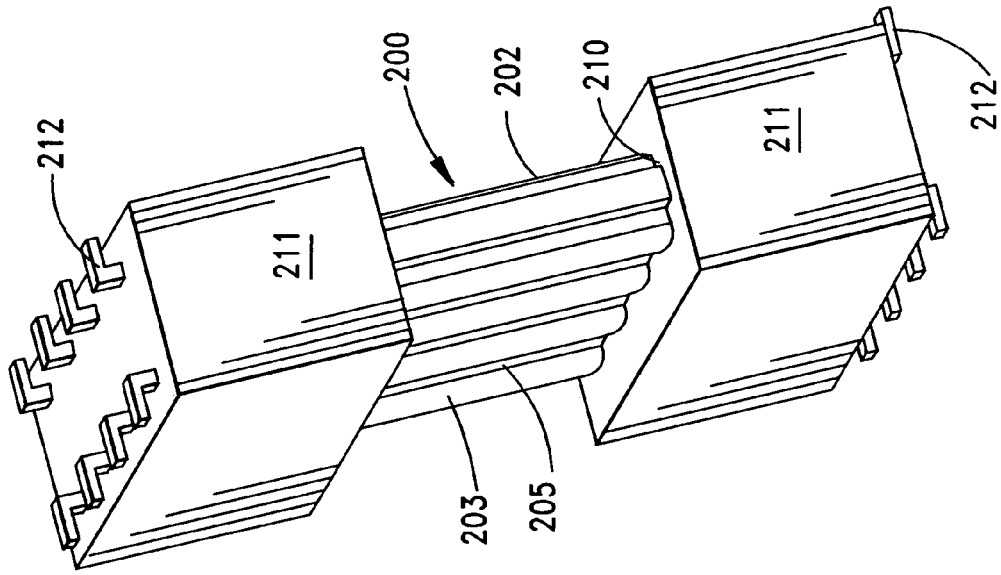
FIG. 16 is a perspective view of a connector assembly having two connector housings interconnected by the transmission link of FIG. 15.
Figure 15:
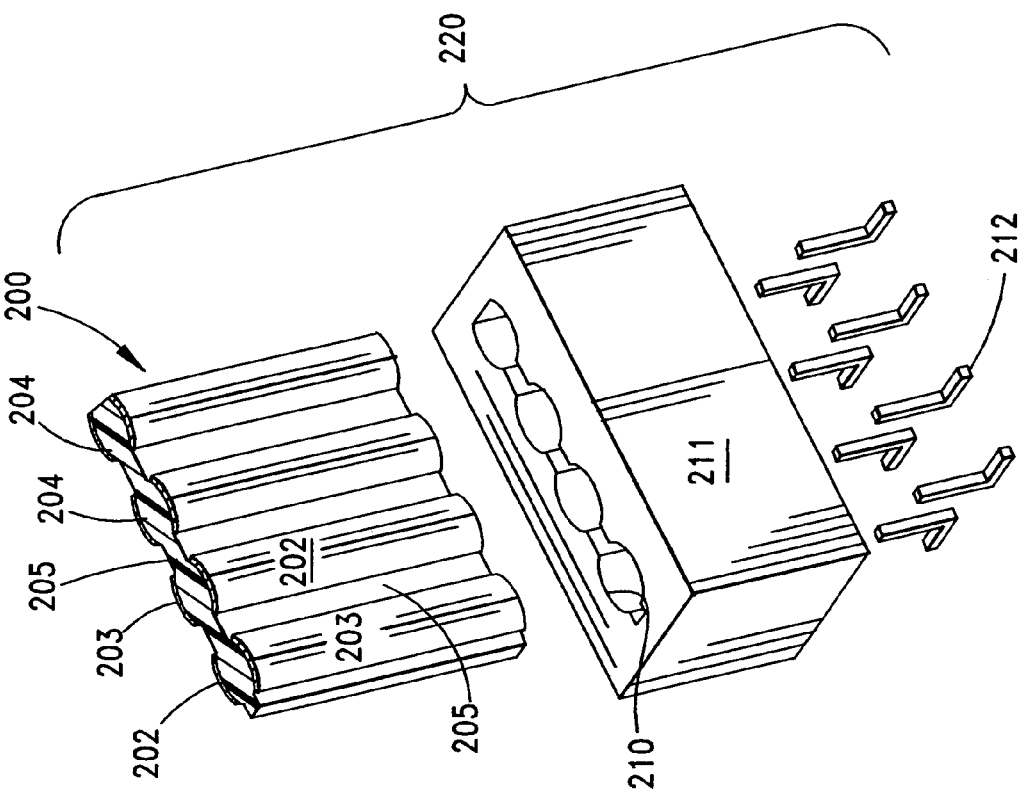
FIG. 15 is an exploded view of a connector assembly incorporating a multiple element link of the invention that is used to provide a transmission line between two connectors.

Importantly, the transmission link may be formed as a single extrusion 200 (FIGS. 15–16) carrying multiple signal channels thereupon, with each such channel including a pair of conductive surface 202–203. These conductive surfaces 202, 203 are separated from each other by the intervening dielectric body 204 that supports them, as well as web portions 205 that interconnect them together. This extrusion 200 may be used as part of an overall connector assembly 220, where the extrusion is received into a complementary shaped opening 210 formed in a connector housing 211. The inner walls of the openings 210 may be selectively plated, or contacts 212 may be inserted into the housing 211 to contact the conductive surfaces and provide, if necessary, surface mount or through hole tail portions.

Figure 17:
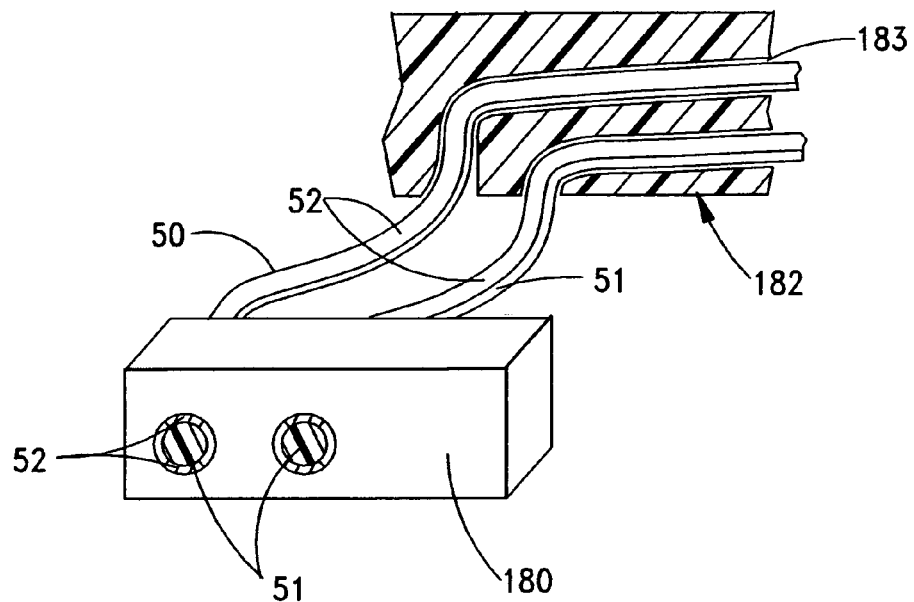
FIG. 17 is a diagrammatic view of a transmission channel of the present invention with two interconnecting blocks formed at opposite ends of the channel and illustrating the potential flexible nature of the invention.

FIG. 17 illustrates the arrangement of two transmission channels 50 arranged as illustrated and terminated at one end to a connector block 180 and passing through a right angle block 182 that includes a series of right angle passages 183 formed therein which receive the transmission channel links as shown. In arrangements such as that shown in FIG. 17, it will be understood that the transmission channel links may be fabricated in a continuous manufacturing process, such as by extrusion, and each such channel may be manufactured with intrinsic or integrated conductive elements 52. In the manufacturing of these elements, the geometry of the transmission channel itself may be controlled, as well as the spacing and positioning of the conductive elements upon the dielectric bodies so that the transmission channels will perform as consistent and unitary electronic waveguides which will support a single channel or "lane" of signal (communication) traffic. Because the dielectric bodies of the transmission channel links may be made rather flexible, the systems of the invention are readily conformable to various pathways over extended lengths without significantly sacrificing the electrical performance of the system. The one connector endblock 180 may maintain the transmission channels in a vertical alignment, while the block 182 may maintain the ends of the transmission channel links in a right angle orientation for termination to other components.

Figure 18:
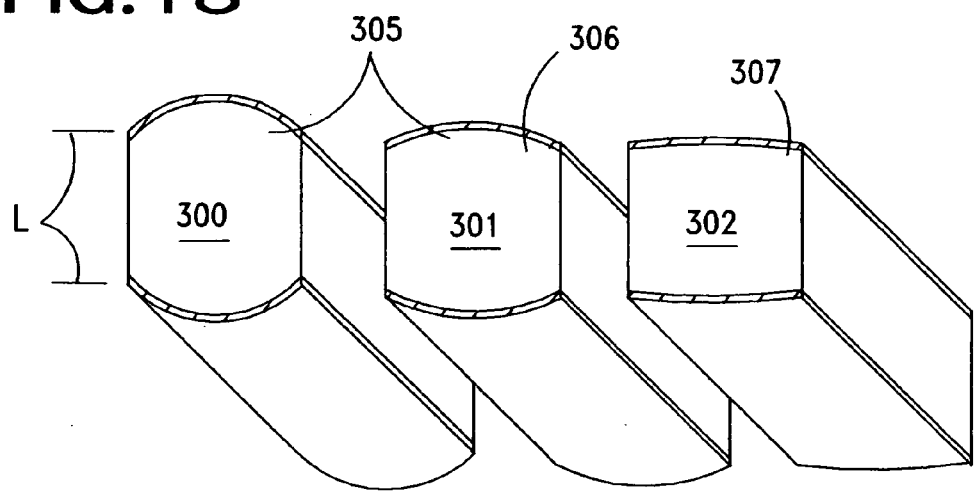
FIG. 18 is a perspective view of an array of differently configured dielectric bodies that may be used as links of the with different lens characteristics.

FIG. 18 illustrates a set of convex dielectric blocks or bodies 300–302 in which separation distance L varies and the curve 305 of the exterior surfaces 306 of the blocks rises among the links 300–302. In this manner, it should be understood that the shapes of the bodies may be chosen to provide different lens characteristics for focusing the electrical fields developed when the conductive elements are energized.

Figure 19:
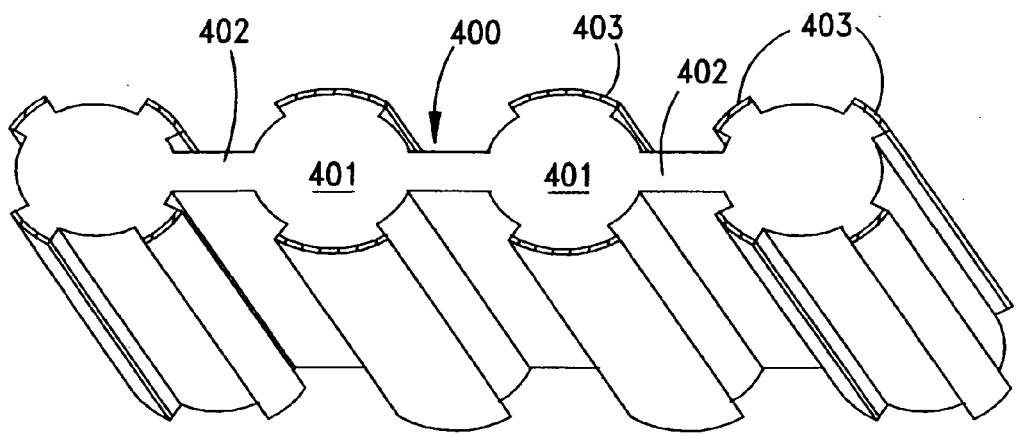
FIG. 19 is a perspective view of a multiple transmission link extrusion with different signal channels formed thereon.
Figure 20:
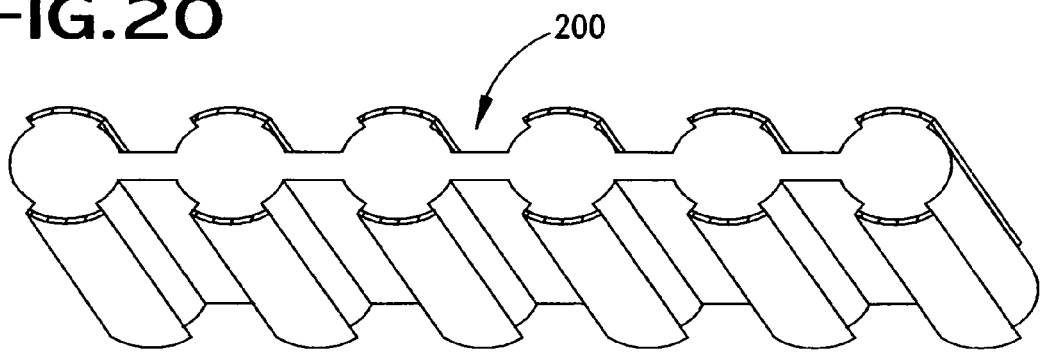
FIG. 20 is a perspective view of a multiple transmission link extrusion used in the invention.

FIG. 19 illustrates a multiple channel extrusion 400 with a series of dielectric bodies or blocks 401 interconnected by webs 402 in which the conductive surfaces 403 are multiple or complex in nature. As with the construction shown in FIG. 13, such an extrusion 400 supports multiple signal channels, with each of the channels preferably including a pair of differential signal conductive elements. FIG. 20 illustrates a standard extrusion 200 such as that shown in FIGS. 15 and 16.

Figure 21:
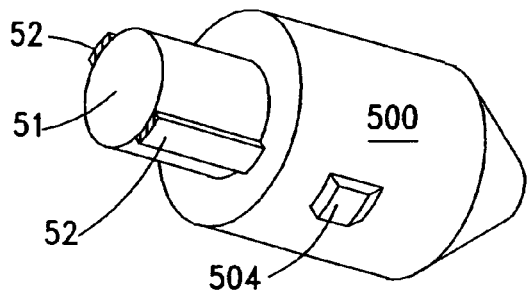
FIG. 21 is a perspective view of a mating interface used with a discrete transmission link of the invention, in which mating interface takes the form of a hollow endcap.
Figure 22:
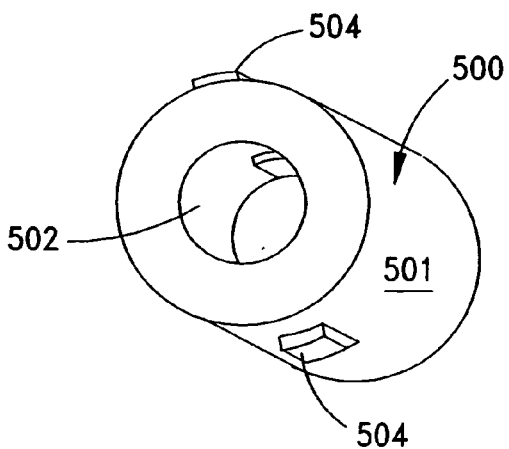
FIG. 22 is a rear perspective view of the endcap of FIG. 21, illustrating the center opening thereof that receives an end portion of the transmission link therein.
Figure 23:
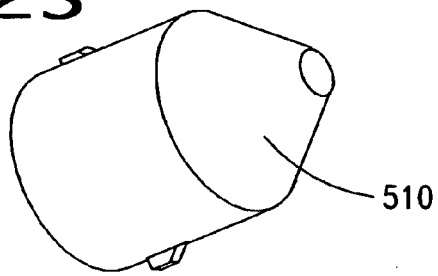
FIG. 23 is a frontal perspective view of the endcap of FIG. 21, illustrating the orientation of the exterior contacts.

The links of the present invention may be terminated into connector and other housings. FIGS. 21–23 illustrate one termination interface as a somewhat conical endcap which has a hollow body 501 with a central openings 502. The body may support a pair of terminals 504 that mate with the conductive surfaces 52 of the dielectric body 51. The endcap 500 may be inserted into various openings in connector housings or circuit boards and as such, preferably includes a conical insertion end 510. The endcap 500 may be structured to terminate only a single transmission line as is illustrated in FIGS. 21–23, or it may be part of a multiple termination interface and terminate multiple distinct transmission lines as illustrated in FIGS. 24 and 25.

Figure 24:
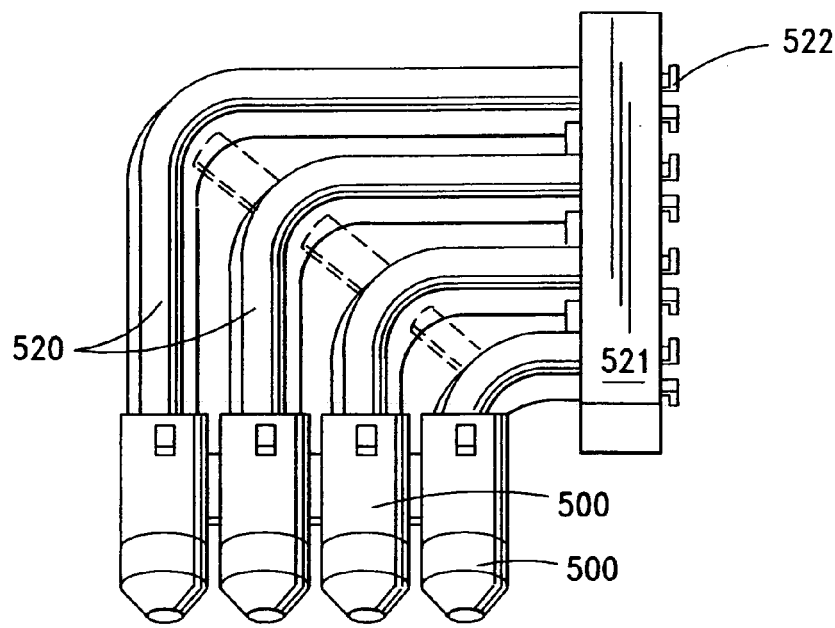
FIG. 24 is a plan view of a multiple transmission link right angle, curved connector assembly.

FIG. 24 illustrates the endcaps 500 in place on a series of links 520 that are terminated to an endblock 521 that has surface mount terminals 522 so that the endblock 521 may be attached to a circuit board (not shown). The endcap need not take the conical structure shown in the drawings, but may take other shapes and configurations similar to that shown and described below.

Figure 25:
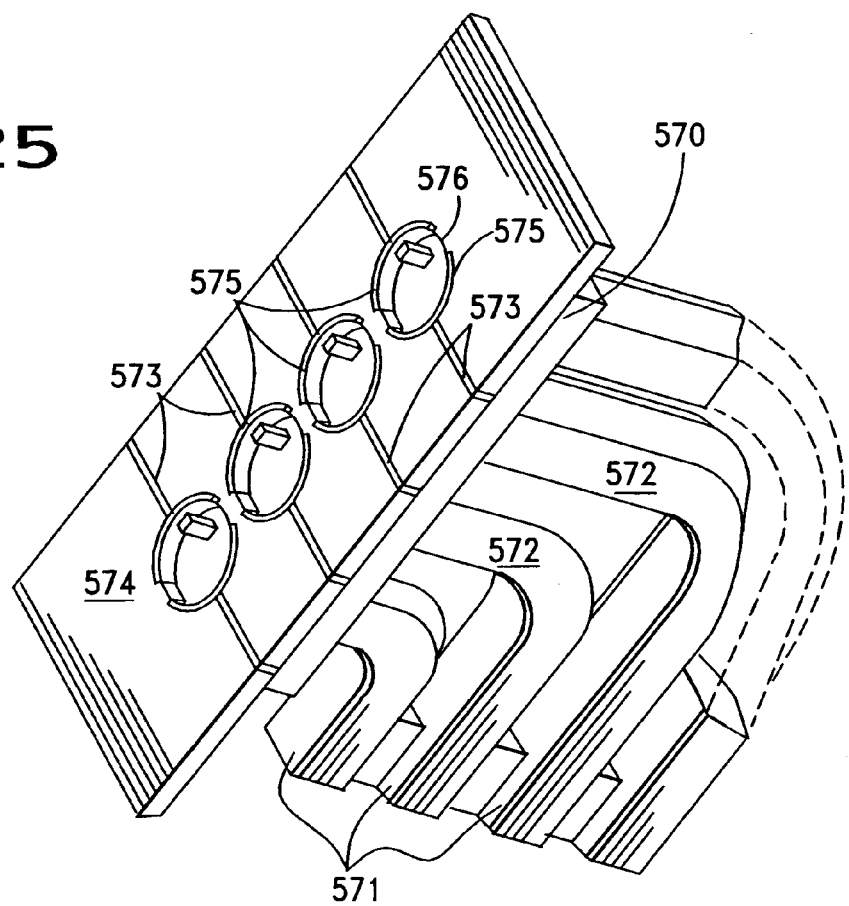
FIG. 25 is a perspective view of an alternate construction of one of the termination ends of the connector assembly.

FIG. 25 illustrates an alternate construction of an end block 570. In this arrangement, the transmission lines, or links 571, are formed from a dielectric and include a pair of conductive extents 572 formed on their exterior surfaces (with the extents 572 shown only on one side for clarity and their corresponding extents being formed on the surfaces of the links 571 that face into the plane of the paper of FIG. 25). These conductive extents 572 are connected to traces 573 on a circuit board 574 by way of conductive vias 575 formed on the interior of the circuit board 574. Such vias may also be constructed within the body of the end block 570, if desired. The vias 575 are preferably split as shown and their two conductive sections are separated by an intervening gap 576 to maintain separation of the two conductive transmission channels at the level of the board.

Figure 26:
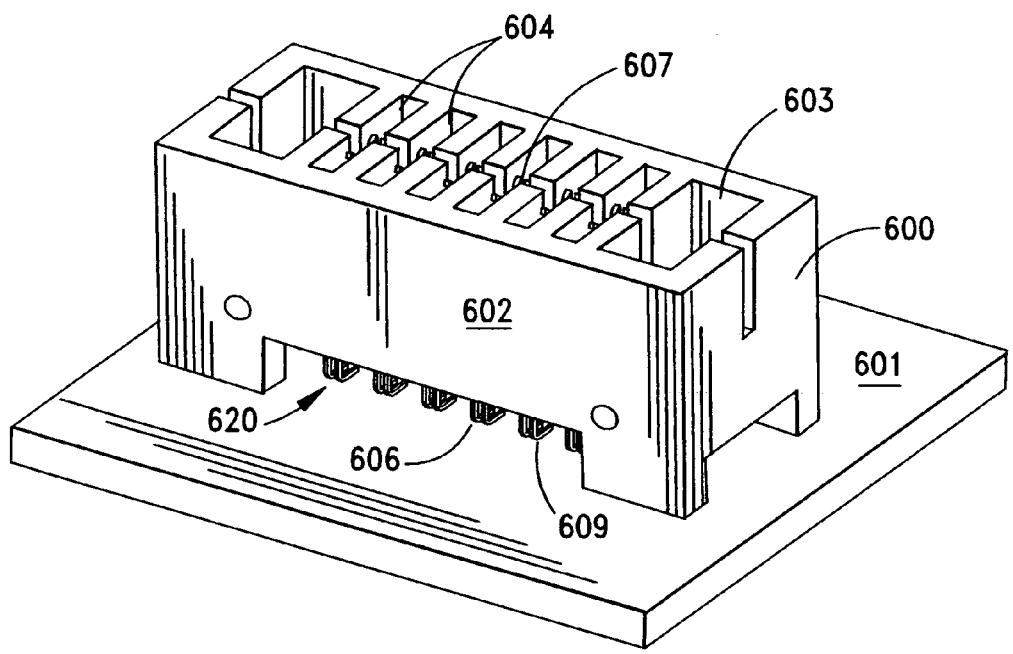
FIG. 26 is a perspective view of a connector suitable for use in connecting transmission channel links of the present invention to a circuit board.

FIG. 26 illustrates an endcap, or block 600 mounted to a printed circuit board 601. This style of endcap 600 serves as a connector and thus includes a housing 602, with a central slot 603 with various keyways 604 that accept projecting portions of the transmission link. The endcap connector 600 may have a plurality of windows 620 for access to soldering the conductive tail portions 606 of the contacts 607 to corresponding opposing traces on the circuit board 601. In instances of surface mount tails a shown, the tails 606 may have their horizontal parts 609 tucked under the body of the endcap housing to reduce the circuit board pad size needed, as well as the capacitance of the system at the circuit board.

Figure 27A:
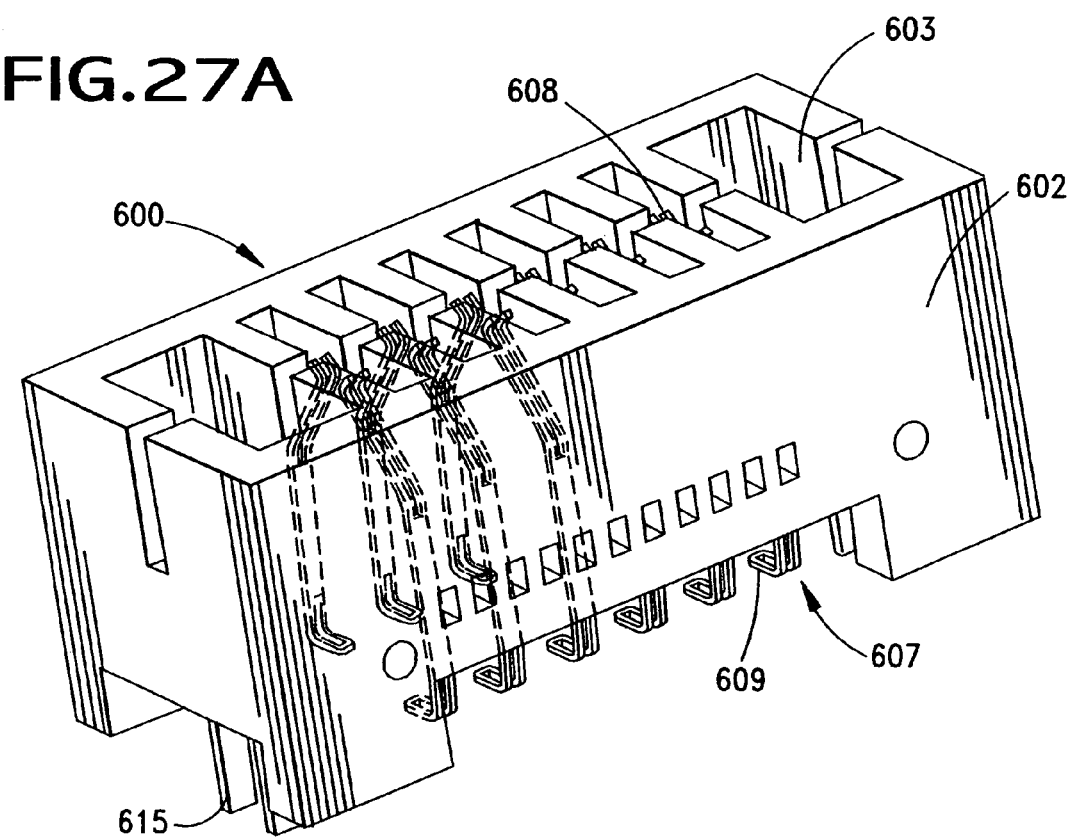
FIG. 27A is a skeletal perspective view of the connector of FIG. 26 illustrating, in phantom, some of the internal contacts of the connector.
Figure 27B:
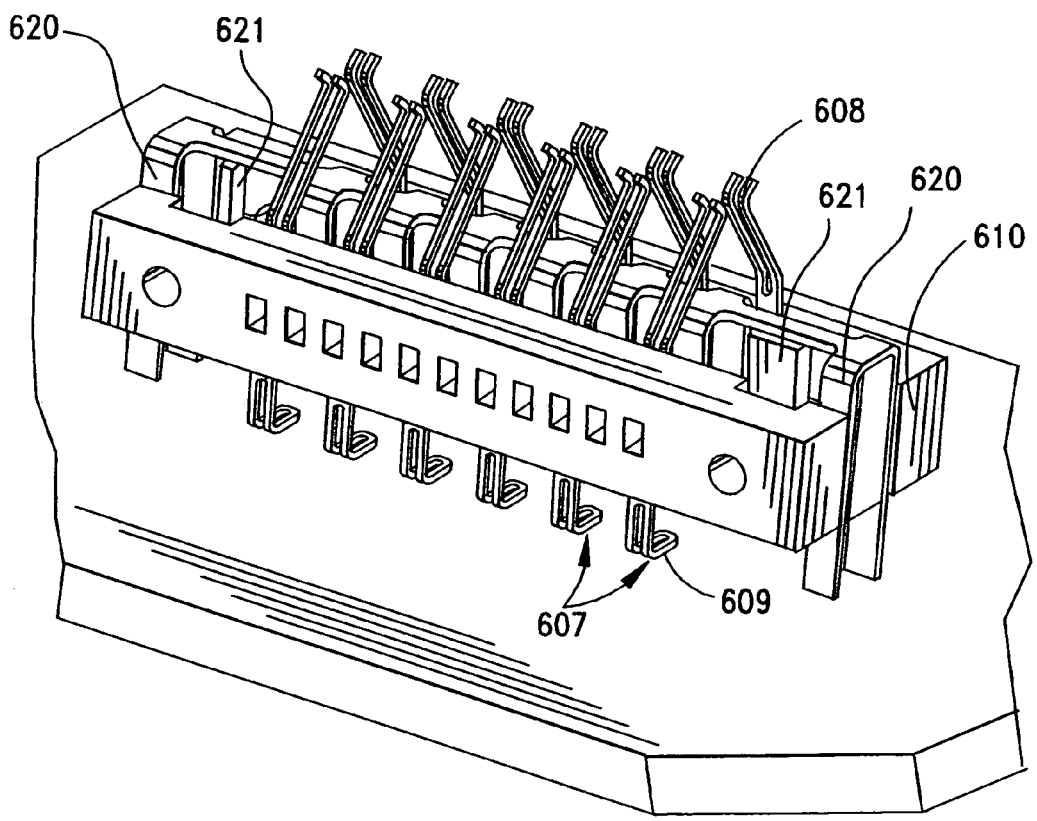
FIG. 27B is a perspective view of the interior contact assembly of the connector of FIG. 27A, with the sidewalls removed and illustrating the structure and placement of the coupling staple thereon.

FIG. 27A illustrates a partial skeletal view of the endcap connector 600 and shows how the contacts, or terminals 607 are supported within and extend through the connector housing 602. The terminals 607 may include a dual wire contact end 608 for redundancy in contact (and for providing a parallel electrical path) and the connector 600 may include a coupling staple 615 that has an inverted U-shape and which enhances coupling of the terminals across the housing. The coupling staple 615 can be seen to have an elongated backbone that extends lengthwise through the connector housing 602. A plurality of legs that are spaced apart from each other by spaces along the length of the coupling staple extend down toward the circuit board and each such leg has a width that is greater than a corresponding width of the terminal that it opposes. As shown in the drawings, the coupling staple legs are positioned in alignment with the terminals. The tail portions of these dual wire terminals 607 enhance the stability of the connector. In this regard, it also provides control for the terminals that constitute a channel (laterally) across the housing slot 601. The dual contact path not only provides for path redundancy but also reduces the inductance of the system through the terminals. FIG. 27B is a view of the interior contact assembly that is used in the endcap connector 600 of FIGS. 26 and 27A. The terminals 607 are arranged on opposite sides of the connector and are mounted within respective support blocks 610. These support blocks 610 are spaced apart from each other a preselected distance that assists in spacing the terminal contacts 608 apart.

A conductive coupling staple 615 having an overall U-shape, or blade shape, may be provided and may be interposed between the terminals 607 and support blocks 610 to enhance the coupling between and among the terminals 607. The coupling staple 615 has a series of blades 620 that are spaced apart by intervening spaces 621 and which are interposed between pairs of opposing contacts (FIG. 28) 608 and which extend downwardly toward the surface of the circuit board. The staple 615 extends lengthwise through the connector body between the connector blocks 610. The connector blocks 610 and the connector housing 602 (particularly the sidewalls thereof) may have openings 616 formed therein that receive engagement plugs 617 therein to hold the two members in registration with each other. Other means of attachment may be utilized, as well.

Figure 28:
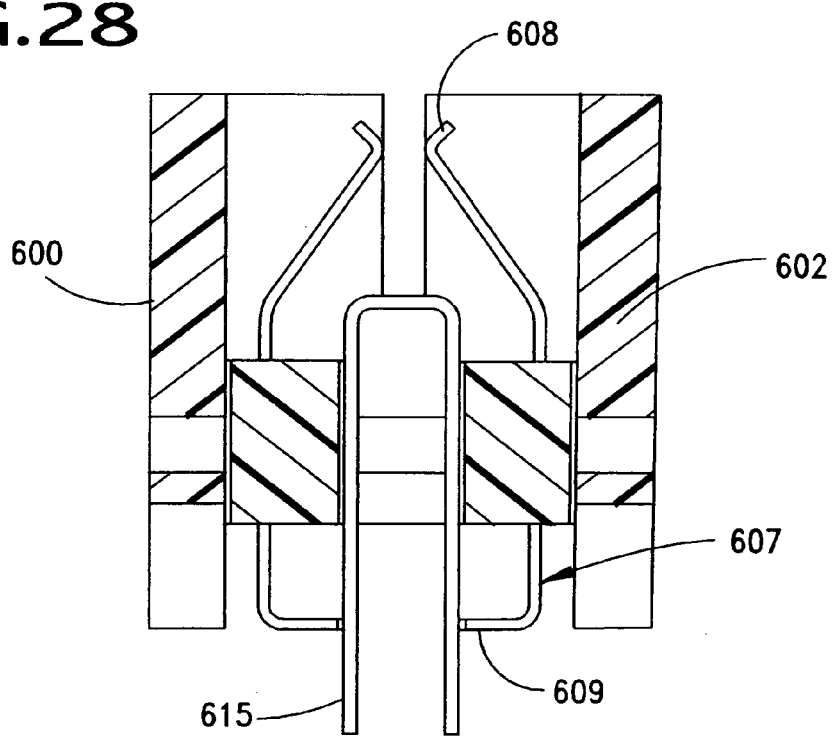
FIG. 28 is a cross-sectional view of the connector of FIG. 26, taken along lines 28—28 thereof.

FIG. 28 is an end view of the connector 600, which illustrates the interposition of the coupling staple between a pair of opposing contacts 608 and the engagement of the connector blocks 610 and the connector housing 602.

Notwithstanding all of the foregoing, FIG. 29 illustrates another embodiment of a transmission channel link constructed in accordance with the principles of the present invention. In FIG. 29, a planar dielectric substrate 700 is provided with a multi-segment transmission line formed by metallization on opposing surfaces of slots that are cut or otherwise formed into a dielectric substrate, such as a circuit board or even an integrated circuit substrate. The metallization on the opposing surfaces are electrically isolated from each other. When a high-frequency signal is impressed on the two separate conductors formed on the opposing surfaces, they act as a transmission line. As shown in FIG. 29, the different segments of the transmission line have different spacing between the sidewalls. Other transmission line segments have sidewalls that converge or diverge. Segments with fixed-spacing sidewalls will have a constant characteristic impedance determined by the distributed inductance and capacitance of the conductive sidewalls. The area and thickness of the conductive material on the opposing surfaces will determine inductance; the area and the spacing between the opposing sidewalls will determine the distributed capacitance. Segments with tapering sidewall spacing will have a transforming characteristic impedance because of the transforming capacitance along the length of such segments.

The different transmission line segments are readily formed into dielectric substrates such as printed circuit boards, and even integrated circuit substrates. Their small size enable them to route high-frequency signals around such substrates to deliver signals carried on the transmission line segments to devices that have or require different characteristic input or output impedances thereby improving signal transfer into, or out of such devices.

In particular, FIG. 29 shows a first transmission line segment 704 of fixed-spacing, metallized sidewalls 712, 714, which will have a fixed characteristic impedance. At the conclusion of the first length of transmission line 704, signals on the metallized sidewalls 712, 714 are carried to a second transmission line segment 720 having sidewalls 722, the spacing of which converges and thereby provides a characteristic impedances that is transforming along the length of the second transmission line segment 720.

The section of transmission line 720 with the transforming impedance feeds signal that it carries into a second length of fixed-spaced, metallized sidewall transmission line 740, which will have a fixed characteristic along its length. The fixed-width sidewall spacing for albeit at a second characteristic impedance.

As can be seen in FIG. 29, a first section of transmission line 704 is made up of a first slot section 706 formed into the surface 703 of the substrate 702. Because the substrate 702 can be made from a variety of appropriate dielectric materials such as glass, fiberglass, various plastics, printed circuit board material, or integrated circuit substrate material (such as undoped amorphous silicon or other known equivalents thereof), the process by which a slot is formed will vary according to the substrate material. The slot section 706 can be molded into a glass substrate; it can be etched into silicon; it can be micromachined, laser etched or otherwise cut into fiberglass, G-10, FR4 or other printed circuit board material.

The first transmission line section 704 comprised of the first slot section 706, has two opposing ends that are identified in FIG. 29 by reference numerals 708 and 710. Those of ordinary skill in the transmission line art will recognize that either end 708 and 710 can be an "input" or an "output" end.

The first slot section 706 has two opposing walls or "surfaces" 712 and 714, between which is shows an a substantially planar bottom 716 of the slot section 706. The opposing surfaces 712, 716 of the first slot section 706 are surfaces of the dielectric material from which the substrate 702 is formed. The two surfaces are spaced apart from each other by a first intervening gap or "space" that is identified as $W_1$ in FIG. 29. Because they are dielectric, the surfaces themselves will not conduct electricity. Therefore, a thin layer of conductive material 718 that carries electrical signals is "attached" to each of the opposing surfaces 712 and 716, by processes appropriate for the substrate material so long as the conductive material 718 applied to one opposing surface (e.g., 712 or 714) is electrically isolated from conductive material applied to the opposing surface (i.e., 714 or 712). Conductive material 718 on one opposing surface (e.g., 712 or 714) that is electrically and spatially isolated from conductive material on the opposite surface (i.e., ., 714 or 712) will together act as a transmission line to high-frequency signals on the two opposing conductors.

As should be appreciated by those of ordinary skill, the distributed inductance of the conductive material 718 on the opposing surfaces 712 and 714 will be a function of the material's composition, the surface area and thickness of the conductive material 718 on the surfaces 712 or 714, and in the case of loop inductance, the inductance of the loop formed by "go" and "return" current is related to the area of the loop that is scribed by the current path. Similarly, the distributed capacitance between the conductive material 718 on the opposed surfaces 712 and 714 will be a function of the material's composition, the surface area of the conductive material, the spacing between the surfaces 712 and 714 and the thickness of the conductive material 718 applied to each surface. As the conductive material 718 on each surface 712 and 714 gets closer, and/or as the surface area of one or both of the conductive material surfaces increases, the capacitive effect between the two conductors (on each surface 712 and 714) will increase. As is well-known, the impedance "Z" of a transmission line can be calculated as $\sqrt{L/C}$, where "L" is the inductance per unit length of transmission line and "C" is the capacitance per unit length of transmission line.

From the foregoing, those of ordinary skill in the transmission line art should understand that the impedance of the first section of slot transmission line 704 can be readily determined by adjusting the slot transmission line's dimensions as well as the thickness of the conductive material 718. In addition to adjusting slot dimensions, impedance can also be adjusted by the dielectric constant of the material filling the space within the slot section 706.

As the intervening air gap or space $W_1$ separating the surfaces 712 and 714 decreases, the capacitance of the transmission line will increase. As "C" increases by decreasing the air gap or space, the impedance of the transmission line section 704 will decrease according to the expression, $Z=1/\sqrt{(L/C)}$. Conversely, as "C" decreases with increases air gap, the impedance "Z" will increase. Increasing the dielectric constant within the air gap however will also increase "C".

It may be desirable in some instances to "fill" or otherwise occupy the air gap of the transmission structures of the invention with a dielectric material, preferably one of a low dielectric constant that preserves a filled volume in the channel while maintaing a very low dielectric constant. This type of structure is useful when implementing the transmission structures of the present invention within a circuit board environment and the filler material can resist entrance into the channel by adjacent layers of circuit board material.

This volume-filling low dielectric constant material can be beneficial in the fabrication process of an embedded transmission line channel in a circuit board by preserving the general integrity of the channel while preventing the entry of a pre-preg material during the addition of laminated material in the layer immediately above the circuit board layer which contains the transmission structure. The filler material may increase the dielectric constant of the air gap to a higher level but still maintain a favorable dielectric constant of the circuit board structured dielectric. In this fashion, a suitable filler material can be engineered and added to prohibit the filling of the transmission channel gaps by circuit board pre-preg material.

Figure 35:
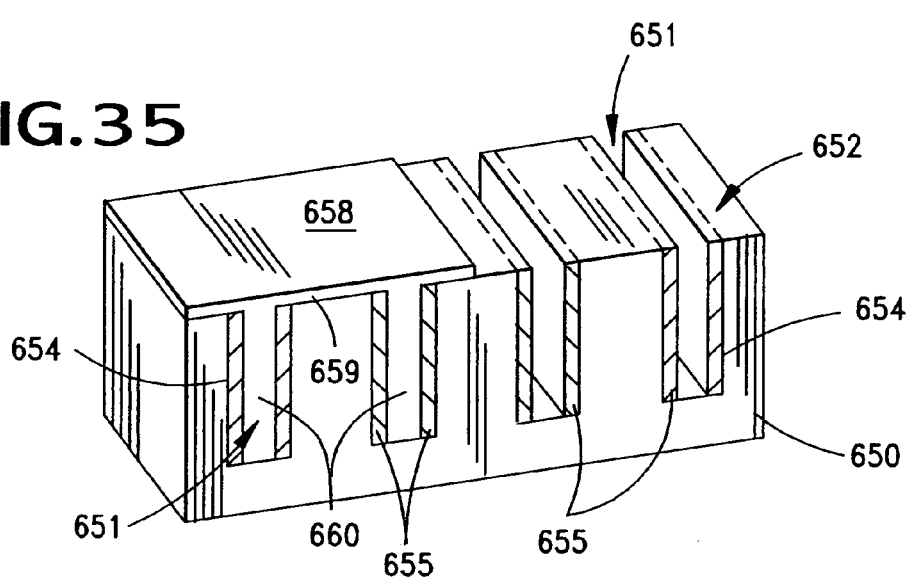
FIG. 35 shows a perspective view of a sealed channel circuit board arrangement.; and, FIG. 36 is an end view of the structure illustrated in FIG. 35.
Figure 36:
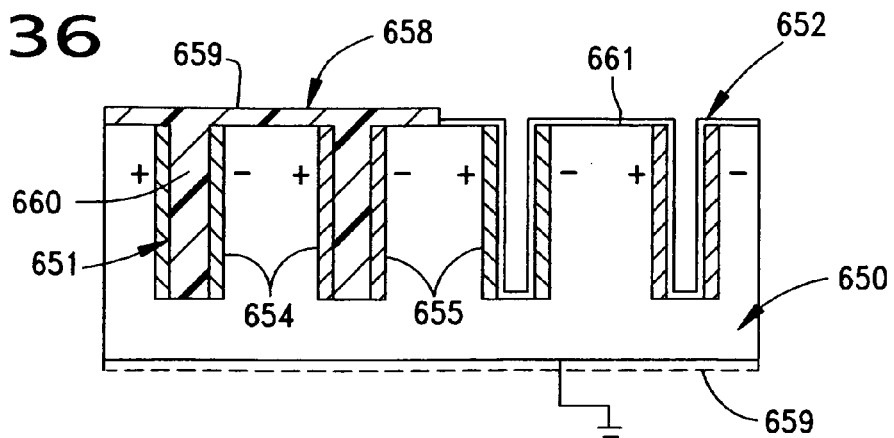

An example of such a filled structure is shown in FIGS. 35 and 36 where a substrate 650 has grooves 651 cut into one surface 652 thereof. The sidewalls of the channels 651 are lined with conductive material 655 and the channels 651 are filled with a material 658 that may form a layer 659 on the surface of the substrate 650 and extend as legs or fingers 660 into the channels.

As shown in FIG. 29, at the second end 710 of the first slot section 706, there is an inflection point at the second end 710 whereat the spacing $W_1$ between the opposing surfaces narrows. The narrowing of the spacing between opposing sidewalls is considered to be the beginning of an impedance transition section of transmission line and is identified in FIG. 29 by reference numeral 720. Like the first slot section 706, the impedance transition section 720 has first and second opposed walls or "surfaces" both of which are identified for clarity by reference numeral 722. The impedance transition section also has a bottom, which in the preferred embodiment is co-planar with the bottom of the first slot section 706.

As the intervening space $W_1$ between the two surfaces 722 decreases in the impedance transition section 720, the intervening space between the surface of conductive material 718 on the two surfaces 722 will also decrease. As a result of the increasing capacitance between the two metallized surfaces, the impedance along the line will gradually decrease, causing the line's characteristic impedance to decrease along the length of the transmission line impedance transformation section 720.

When the physical dimensions of the opposing surfaces 720 match the opposing surfaces 714 and 720, and when conductive surface areas on the opposing surfaces 722 match conductive surface area on the opposing surfaces 712 and 714, the "input" impedance of transition section 720 will match the "output" impedance of the second end 710 of the first slot section. Accordingly, a signal propagating from the input end 708 will not "see" a sudden impedance rise or fall as it travels from the first transmission line section 704 into the second, impedance transforming/transition section 720, but rather will see a smooth or gradual change in impedance. As the spacing between the opposing surfaces 722 decreases along the length of the impedance transition section 720, the impedance "seen" by a signal will gradually decrease due to the increasing capacitance between the conductive material 718 on the opposing surfaces 722. There are reasons to make impedance changes in a transmission line such as to make impedance corrections or to match a non-uniform load and the structure of the present invention permits this to be easily done in sibstarets such as plates and circuit boards and the like.

As shown in FIG. 29, the spacing between the sidewalls 722 of the impedance transition section 720 narrows continuously along the length of the section 722 up to a second inflection point 724. The first inflection point 710 is considered both the "second" or "output" end of the first transmission line section 704 and the "first" or "input" end of the first impedance transition section 720. The second inflection point 724 is considered to be the "second" or "output" end of the impedance transition section 720 as well as "first" or "input" end of a second transmission line/second slot section that is identified by reference numeral 740.

Like the first fixed-sidewall-spacing slot section 704, the second fixed-sidewall-spacing slot section 740 also has two ends. As set forth above, the "first" end of the second slot section 740 is identified in FIG. 29 by reference numeral 724 whereas the "second" end of the second slot section 740 is identified by reference numeral 726. Like the first slot section 704 and the impedance transition section 720, the second slot section 730 also has a bottom but it is not readily seen in FIG. 29. In the preferred embodiment the bottom of the second slot section 740 is co-planar with the bottom 716 of the impedance transition section.

Like the first slot section 704, the second slot section 730 also has first and second opposing walls or "surfaces" that are identified in FIG. 29 by reference numerals 728 and 732. As shown in FIG. 29, the air gap or space $W_1$ that is "intervening" between the opposing surfaces 728 and 732 of the second slot section 730 is considerably less than the intervening air gap or space $W_1$ of the first slot section 706.

As shown in FIG. 29, conductive material 718 on the opposing surfaces 712 and 714 of the first slot section 706 exists through the entire length of the impedance transition section 720 as well as on the opposing surfaces 728 and 730 of the second slot section 740. Because the spacing between the conductive surfaces changes along the different segments, the distributed capacitance between the conductive surfaces also changes. In the second slot section 740, the capacitance that exists between the conductive material 718 on the opposing sides 728 and 730 will be greater than the distributed capacitance of the first slot section 706. As a result, the characteristic impedance of the second slot section 740 will be less than the characteristic impedance of the first slot section 704.

In the preferred embodiment, physical dimensions and conductive material 718 of abutting slot sections (704/720; 720/740; 740/750; 750/760)) are precisely matched. By matching physical dimensions and conductive material 718 at adjoining ends of different slot sections, the impedances of the adjoining ends will be matched to each other. Signal reflections on the transmission line caused by impedance discontinuities along the transmission line will be reduced or even eliminated as a consequence of having impedance correction to non-uniform loads.

When a signal is introduced into the first transmission line section 704 at its input end 708, it will travel through the first transmission line section 704 and into the impedance transition section 720 with minimal wave reflections. Once through the impedance transition section, the signal will be carried into the second transmission line section, again with minimal reflections. The changing dimensions of the slot sections that make up the first transmission line section, the impedance transition section and the second transmission line/second line section transform or alter the characteristic impedance encountered by the signal as it propagates through the different sections 704, 720 and 740. As such, the varying slot dimensions provide an apparatus and method for providing a transmission line on a substrate, such as a circuit board or even an integrated circuit having a transforming impedance along its length.

Still referring to FIG. 29, there is shown a second impedance transition section 750 at the "second" or output end 726 of the second slot section 740. This second impedance transition section 750 also has opposing walls or surfaces. It also has a bottom that is co-planar with the bottoms of the first slot section 704, the first impedance transition section 720 and the second slot section 740. The opposing walls/surfaces of the second impedance transition section are also coated with the conductive material 718 to form a continuous conductive path back to the input end 708 of the first slot section 704.

As a signal propagates into the second impedance transition section 750, the characteristic impedance of the second impedance transition section 750 increases as the intervening space between the opposing walls/surfaces increases, thereby decreasing the capacitance between the conductive material 718 on the opposing surfaces.

The output or second end of the second impedance transition section 750 is identified in FIG. 29 by reference numeral 752. The output or second end 752 of the second impedance transition section 750 is also the input or first end of a third slot section 760. As shown in FIG. 29, the width of the third slot section 760 is greater than the width of the second slot section 740, which will cause the characteristic impedance of the third slot section 760 to increase. Because the characteristic impedance at the junction of these two sections (750 and 760) are matched by virtue of their matched dimensions, a signal propagating through the second impedance transition section 750 will be carried into the third slot section 760.

It should be apparent to those of ordinary skill in the art that the impedance of the transmission line formed in a substrate such as a circuit board or even an integrated circuit can be transformed simply by changing the geometry of the opposing conductors formed by conductive material deposited on opposing sides of slots that are also formed in a dielectric substrate. Electronic devices on a circuit board or in an integrated circuit that require a matched input or load impedance will yield improved performance through a smooth and controlled impedance transition in accordance with those of the present invention.

Still referring to FIG. 29, electronic devices 770 and 780 are shown as being mounted to the upper surface 703 of the substrate 702. One device 770 is shown electrically connected to the second transmission line/slot segment 740; a second device 780 is shown electrically connected to the first transmission line section 704. If the first device 770 requires an input or output impedance different than the second device 780, the impedance of the transmission line segment to which either device is connected can be readily adjusted to match a signal source or load in the first device 770 by varying the dimensions of the slot to which the device is connected.

FIG. 30A and FIG. 30B show a top view and an end view respectively of a dielectric substrate in which a slot with metallized sidewalls is formed. The waveguide shown in FIG. 30A has four separate sections, two of which are impedance transforming sections. As shown in FIG. 30A, a conductive surface or layer 718 is deposited onto the opposing dielectric walls/surfaces 712 and 714, between which is the slot bottom 716.

Section S1 is a constant-impedance section by virtue of the constant spacing between the opposing sidewalls 712 and 714. When section S1 meets section S2, the sidewall spacings and metallization of the two abutting sections are matched providing for a reflection-less signal transfer between sections S1 and S2.

Section S2 has sidewalls the spacing of which narrows along its length. The spacing between the conductive material 718 deposited onto the opposing surfaces 712 and 714 decreases thereby decreasing the characteristic impedance along the length of the second section S2. As the second section S2 meets the third section, S3, the characteristic impedance at the intersection of the second and third sections S2/S3 will be matched, improving the signal transfer between sections S1, S2 and S3. As shown, the fourth section S4 increases its sidewall spacing as shown, thereby increasing the characteristic impedance of the fourth section S4.

FIG. 31A and FIG. 31B show an alternate embodiment of the transforming impedance transmission line sections. In FIG. 31A and FIG. 31B, the transitions between slot sections S1, S2 and S3 are smooth, further reducing possible impedance discontinuities between the transmission line segments that might be caused by abrupt changes in sidewall spacing.

Figure 32:
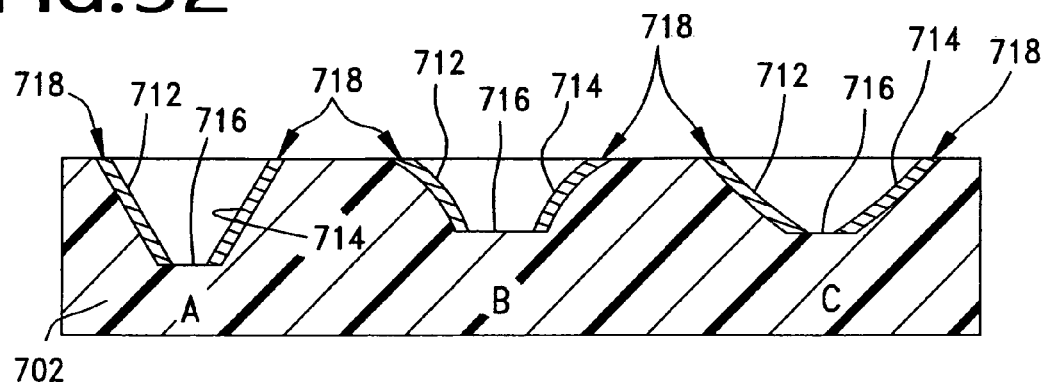
FIG. 32 shows different embodiments of the sidewalls used in the transmission line shown in FIG. 29.

While the embodiment shown in FIG. 29 depicts opposing sidewalls that are substantially orthogonal to the bottoms 718 of the slot sections, FIG. 32 shows that the sidewalls of the slot sections can be inclined linear sections as shown in slot "A" but also curved, non-linear walls as shown in slots "B" and "C." The sidewalls 712, 714 of slot "A" in FIG. 32 are inclined with respect to the plane of the bottom 716. In contrast, the sidewalls 712 and 714 of slot "B" are concave and parabolic but may also be elliptical. By inclining the sidewalls or imbuing them with a concave or convex cross-section, the slots' may be more easily coated with conductive material 718 thereby reducing the cost to manufacture a circuit board or integrated circuit substrate. For purposes of claim construction, a "linear" sidewall should be construed to include sidewalls that orthogonal to the slot bottoms as well as walls that are inclined as shown in view "A" of FIG. 32. "Non-linear" sidewalls should be construed to mean sidewalls that are parabolic, elliptical or any other geometric shape that is not linear.

Figure 33A:
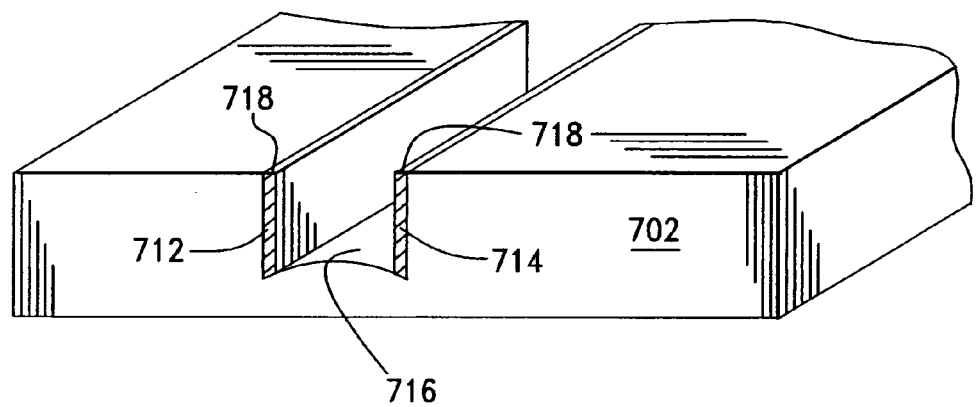
FIG. 33A shows an alternate embodiment of the bottom used in the transmission line shown in FIG. 29.
Figure 33B:
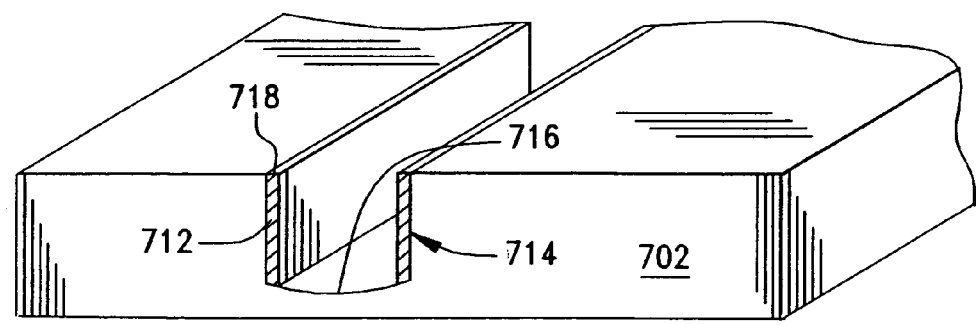
FIG. 33B shows an alternate embodiment of the bottom used in the transmission line shown in FIG. 29.
Figure 34:
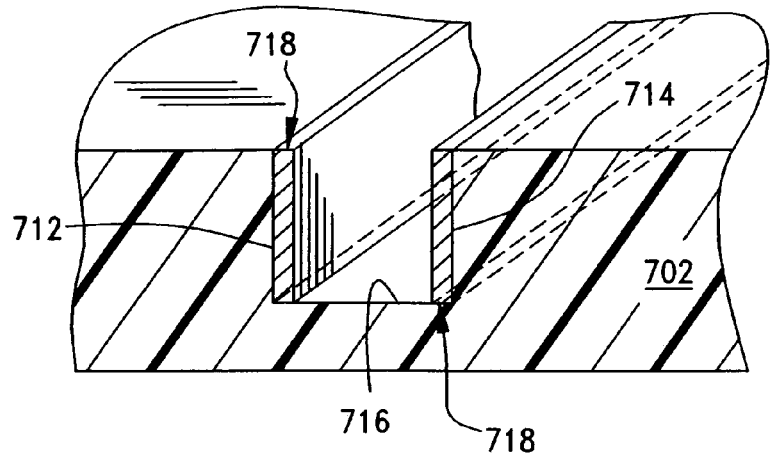
FIG. 34 shows a cross-sectional view of a slot filled with a non-air dielectric.

Although the embodiment shown in FIG. 29 depicts slot section bottoms 716 that are planar or nearly planar, alternate embodiments of the invention can have slot bottoms 716 that are non-planar. FIGS. 33A and 33B show end-views of slot section bottoms that are either convex or concave (depending on the viewers point of reference) and therefore non-planar. Making the slot bottoms 716 non-planar can improve the registration of conductive material strips 718 against the opposing side walls 712 and 714 thereby making it easier to apply conductive strips to the opposing sidewalls 712 and 714.

While the preferred embodiment contemplates an air dielectric, empty volume in the slots shown in FIGS. 29–33 can be filled with solid or liquid dielectric material. Partially or completely filled slots in any of the sections will increase the capacitance realized between the opposing conductors can be increased causing a concomitant increase in characteristic impedance. Since a dielectric between the opposing surfaces will increase capacitance, the area of the conductive material 718 that would otherwise have to be used on the surfaces 712 and 714 to obtain a particular distributed capacitance can be reduced. Therefore, the depth of the slots used to yield a particular impedance can be reduced if a non-air dielectric is used to fill the various transmission line slot sections.

As set forth above, the conductive material 718 deposited on the opposed surfaces of the various sections of transmission line form electrically separate conductors. Inasmuch as these conductors are electrically separate, they are also considered to be "differential signal pairs" which are known to those of skill in the art to be paired conductors that carry alternating-polarity signals; there is no D.C. signal average present on the two conductors. Differential signals are well-known to be those of ordinary skill in the art and the conductors in the embodiments described above should be considered to be useful as differential signal pairs.

FIGS. 35 and 36 illustrate the embodiment dealing with a sealed channel type of arrangement that is suitable for use in a printed circuit board construction. They utilize a grouped element channel transmission structure 650, that is particularly suitable for carrying high voltages and currents at high-density contact spacings. The body of the transmission line 650 may be formed from a dielectric or may be incorporated into a circuit board layer and it has a series of grooves, or slots 651, formed therein that extend into the body portion thereof from one surface 652 thereof. The sidewalls 654 of these slots are conductively coated with a conductive material, such as by plating, and in effect define a series of "plates" 655 that are opposed to each other and are separated by the intervening space, or air, that will typically occupy the slots 651. In the left of FIGS. 35 and 36, a plug 658 is shown that fills the channel and this plug may include a cap portion 659 and one or more tongues, or fillers 660 that depend from the cap portion 659 and which extend into and completely occupy the space of the slots 651. The plug 658, especially the fill portion 660 thereof extends between the opposing conductive surfaces and insulates them to prevent arcing from occurring between them. The plug may be is filled with a dielectric material that preferably has a dielectric constant chosen to affect the coupling between the conductors, and typically, the dielectric constant will be one that is equal to or greater higher than the dielectric constant of the dielectric body. A ground plane 659 may be deposited on the lower surface of the transmission line of FIGS. 35 & 36 to provide increased capacitive coupling.

In this manner, and as shown best schematically in FIG. 36, the opposed polarity (i.e., "+" or "−") conductive pairs of contacts are electrically isolated from each other, but nevertheless define a complete circuit. The sizes involved with the transmission elements of the present invention permit very high densities to be achieved with a low inductance delivery mode, especially due to the large number of common parallel current paths. To the right of FIG. 36 is shown another means for accomplishing this isolation, preferably with signal transmitting conductive surfaces, namely the use of a conformal coating 661 that conforms to the overall slot and land configuration but which provides electrical insulation or isolation between the two conductive surfaces. The spacing between the plated surfaces 654, 655 may be very small, on the order of 0.4 mm and the like and the insulative coating or film 661 prevents arcing or shorting between pairs of conductive elements. The use of opposed pairs in the transmission lines, over which is traversed current across and possibly on two opposing surfaces thereof, will lead to a lower loop inductance of the transmission line system. The conformal coating or film 661 preferably has a dielectric constant that is lower than that of the dielectric body and a dielectric constant that is close to that of air, 1.0 is most preferred.

From the foregoing, it should be apparent to those of ordinary skill that small, high-frequency transmission lines can be formed into a dielectric substrate by metallizing opposing sidewalls of slots cut through dielectric substrate. Inasmuch as the spacing (and dielectric) between the sidewalls determines the transmission line's impedance, the impedance of the transmission line can be transformed along its length by changing the sidewall spacing, the metallization on the sidewall as well as the type and amount of dielectric between the sidewalls. Electronic components that have particular input or output impedances can be provided with signals from impedance-matched transmission line.

While the preferred embodiment of the invention have been shown and described, it will be apparent to those skilled in the art that changes and modifications may be made therein without departing from the spirit of the invention, the scope of which is defined by the appended claims.

The invention claimed is:

1. A transmission line for high-frequency differential signals and having a transforming impedance, said transmission line comprising:
   a dielectric body;
   a first transmission line section that is comprised of a first slot in said dielectric body and having first and second transmission line ends and a first characteristic impedance between said first and second transmission line ends;
   a second transmission line section that is comprised of a second slot in said dielectric body, said second transmission line also having first and second ends but having a second characteristic impedance between its first and second ends; and,
   an impedance transition section of transmission line, having a first end coupled to the second end of said first transmission line section and a second end coupled to the first end of said second transmission line section, the first end of said impedance transition section having said first characteristic impedance, the second end of the impedance transition section having said second characteristic impedance.

2. A transmission line for high-frequency differential signals and having a transforming impedance displaced along the transmission line, said transmission line comprising:
- a dielectric substrate;
- a first slot section in said dielectric substrate having first and second ends, said first slot section having first and second opposing surfaces and a bottom between the first and second opposing surfaces, said opposing surfaces of said first slot section being spaced apart from each other by a first intervening space, a portion of said first and second opposing surfaces each having a conductive surface capable of carrying electrical signals, said first slot section having a first characteristic impedance between its first and second ends;
- a second slot section in said dielectric substrate also having first and second ends, said second slot section also having first and second opposing surfaces and a bottom between the first and second opposing surfaces, said opposing surfaces of said second slot section being spaced apart from each other by a second intervening space, a portion of said first and second opposing surfaces of said second slot section each having a conductive surface capable of carrying electrical signals, said second slot section having a second characteristic impedance between its first and second ends; and,
- an impedance transition section comprised of a slot in said dielectric substrate having tapered, conductive opposing surfaces, said impedance transition section having a first end coupled to the second end of said first slot section, and further having a second end coupled to the first end of said second slot section, said first end of said impedance transition section having an impedance equal to said first characteristic impedance, said second end of said impedance transition section having an impedance equal to said second characteristic impedance.

3. The transmission line of claim 2, wherein said conductive surfaces in said first and second slot sections and in said impedance transition section are differential signal pairs.

4. The transmission line of claim 2, wherein conductive surfaces are comprised of at least one of: metal plated plastic; vapor deposited metal; etched metal.

5. The transmission line of claim 2, wherein at least one of said first slot section, said impedance transition section and said second slot section, is at least partially filled with dielectric material and wherein said dielectric material also determines characteristic impedance.

6. The transmission line of claim 2, wherein at least one of said first slot section, said impedance transition section and said second slot section, have opposing surfaces that are substantially orthogonal to the corresponding bottom of said slot section, said impedance transition section and said second slot section.

7. The transmission line of claim 2, wherein the opposing surfaces of at least one of said first slot section, said impedance transition section and said second slot section, are linear.

8. The transmission line of claim 2, wherein the surfaces of at least one of said first slot section, said impedance transition section and said second slot section, is non-linear.

9. The transmission line of claim 2, wherein the bottom of at least one of said first slot section, said impedance transition section and said second slot section, is non-planar.

10. A circuit board comprising a planar dielectric substrate having a thickness T;
- a first slot section in the dielectric substrate, said first slot section having a first end, a second end and a depth less than T, said first slot section having first and second opposing and conductive side walls and a bottom between the first and second opposing side walls, said side walls of said first slot section being spaced apart from each other by a first intervening space, the conductive sidewalls being capable of carrying differential electrical signals, the spacing between the conductive surfaces, the dielectric in said first intervening space and the area of the conductive surfaces determining a first characteristic impedance of said first slot section;
- a second slot section in the dielectric substrate, said second slot section also having a first end, a second end and a depth less than T, said second slot section also having first and second opposing and conductive side walls and a bottom between the first and second opposing side walls, said side walls of said second slot section being spaced apart from each other by a second intervening space, the conductive sidewalls being capable of carrying differential electrical signals, the spacing between the conductive surfaces, the dielectric in said second intervening space and the area of the conductive surfaces determining a second characteristic impedance of said first slot section; and,
- an impedance transition section having first and second opposing side walls between its first and second ends, the opposing sidewalls at said first end of the impedance transition section mating with and coupled to the sidewalls of the first slot section, the opposing walls at said second end of the impedance transition section mating with and coupled to the sidewalls of the second slot section, said impedance transition section having said first characteristic impedance at its first end and having said second characteristic impedance at its second end, the opposing side walls of the impedance transition section being tapered to transform the characteristic impedance of the impedance transition section between its first and second ends.

11. The circuit board of claim 10, wherein said conductive surfaces are differential signal pairs.

12. The circuit board of claim 10, wherein at least one of said first slot section, said impedance transition section and said second slot section, is at least partially filled with dielectric material.

13. The circuit board of claim 10, wherein the side walls of at least one of said first slot section, said impedance transition section and said second slot section, are linear.

14. The circuit board of claim 10, wherein the side walls of at least one of said first slot section, said impedance transition section and said second slot section, are non-linear.

15. The circuit board of claim 10, wherein conductive surfaces are metal plated plastic, sputtered, vacuum deposited metal or etched metal.

16. A circuit board comprised of a planar dielectric substrate, capable of carrying electronic components thereon and having a thickness T; and
- a transmission line formed into said planar dielectric substrate, said transmission line having a transforming impedance and being comprised of a first slot section in the planar dielectric substrate that forms a first transmission line segment with a first characteristic impedance, said first slot section having a first end and a second end, said first slot section having first and second metallized opposing side walls and a bottom between the first and second opposing metallized side walls, said side walls of said first slot section being spaced apart from each other by a first intervening space, said conductive surface capable of carrying differential electrical signals;

a second slot section in the planar dielectric substrate that forms a second transmission line segment with a second characteristic impedance, said second slot section also having a first end and a second end, said second slot section also having first and second metallized opposing side walls and a bottom between the first and second opposing metallized side walls, said side walls of said second slot section being spaced apart from each other by a second intervening space, said conductive surface capable of carrying differential electrical signals; and, an impedance transition section between the second end of the first slot section and the first end of the second slot section, said impedance transition section having a first end with said first characteristic impedance and a second end having said second characteristic impedance, said impedance transition section having first and second opposing side walls, the separation of which is tapered to provide a varying impedance along the length of said impedance transition section;

a first electronic device, mechanically attached to said planar dielectric substrate and electrically coupled to said first slot section, said first electronic device having an input impedance corresponding to the first characteristic impedance; and, a second electronic device coupled to conductive surfaces of said second slot section and having an input impedance matched to said second characteristic impedance.

17. The circuit board of claim 16, wherein at least one of said first slot section, said impedance transition section and said second slot section, is at least partially filled with dielectric material.

18. The circuit board of claim 16, wherein the side walls of at least one of said first slot section, said impedance transition section and said second slot section, are linear.

19. The circuit board of claim 16, wherein the side walls of at least one of said first slot section, said impedance transition section and said second slot section, are non-linear.

20. The circuit board of claim 16, wherein said conductive surfaces are differential pairs.

* * * * *